(12) United States Patent
Hanna et al.

(10) Patent No.: US 10,158,087 B2
(45) Date of Patent: Dec. 18, 2018

(54) ORGANIC THIN FILM, AND ORGANIC SEMICONDUCTOR DEVICE AND ORGANIC TRANSISTOR USING SAME

(71) Applicants: DIC Corporation, Tokyo (JP); TOKYO INSTITUTE OF TECHNOLOGY, Tokyo (JP)

(72) Inventors: Junichi Hanna, Tokyo (JP); Hiroaki Iino, Tokyo (JP); Yasuyuki Watanabe, Sakura (JP); Junichiro Koike, Sakura (JP); Hiroshi Maki, Sakura (JP); Yutaka Tachikawa, Sakura (JP); Atsuhisa Miyawaki, Sakura (JP); Yoshinobu Sakurai, Sakura (JP)

(73) Assignee: DIC CORPORATION (TOKYO), Tokyo (JP)

( * ) Notice: Subject to any disclaimer, the term of this patent is extended or adjusted under 35 U.S.C. 154(b) by 0 days.

(21) Appl. No.: 14/773,053

(22) PCT Filed: Mar. 6, 2014

(86) PCT No.: PCT/JP2014/055824
§ 371 (c)(1),
(2) Date: Oct. 27, 2015

(87) PCT Pub. No.: WO2014/136898
PCT Pub. Date: Sep. 12, 2014

(65) Prior Publication Data
US 2016/0049596 A1 Feb. 18, 2016

(30) Foreign Application Priority Data

Mar. 7, 2013 (JP) ................................. 2013-045269
Jul. 31, 2013 (JP) ................................. 2013-159033

(51) Int. Cl.
*H01L 51/00* (2006.01)
*H01L 51/05* (2006.01)
*C09K 19/34* (2006.01)

(52) U.S. Cl.
CPC ...... *H01L 51/0074* (2013.01); *C09K 19/3491* (2013.01); *H01L 51/0076* (2013.01); *H01L 51/0026* (2013.01); *H01L 51/0068* (2013.01); *H01L 51/0558* (2013.01)

(58) Field of Classification Search
CPC ............. H01L 51/0074; H01L 51/0076; H01L 51/0026; H01L 51/0558; H01L 51/0068; C09K 19/3491
See application file for complete search history.

(56) References Cited

U.S. PATENT DOCUMENTS

| | | |
|---|---|---|
| 2005/0214952 A1 | 9/2005 | Stupp et al. |
| 2010/0012929 A1* | 1/2010 | Nakano .................. C09K 11/06 257/40 |
| 2010/0025672 A1 | 2/2010 | Okada et al. |
| 2010/0032655 A1 | 2/2010 | Takimiya et al. |
| 2010/0155663 A1 | 6/2010 | Watanabe et al. |
| 2011/0024731 A1 | 2/2011 | Takimiya et al. |
| 2014/0081028 A1 | 3/2014 | Hanna et al. |

FOREIGN PATENT DOCUMENTS

| | | |
|---|---|---|
| JP | 2008-10541 A * | 1/2008 |
| WO | 2006/077888 A1 | 7/2006 |
| WO | 2006/121040 A1 | 11/2006 |
| WO | 2008/047896 A1 | 4/2008 |
| WO | 2008/117579 A1 | 10/2008 |
| WO | 2012/121393 A1 | 9/2012 |

OTHER PUBLICATIONS

Payne, M. M.,"Organic Field-Effect Transistors from Solution-Deposited Functionalized Acenes with Mobilities as High as 1 cm2/V⊙ s." Journal of the American Chemical Society 127.14 (2005): 4986-4987.*

Song, C-K., "Pentacene thin film transistor improved by thermal annealing." Journal of the Korean Physical Society 39.SUP (2001): S271-S274.*

JP 2008-10541A; English machine translation ProQuest Oct. 26, 2016 p. 1-37.*

Iino, H.,. "38.1: Highly Thermally-Stable OFETs Fabricated with Liquid Crystalline Organic Semiconductors." SID Symposium Digest of Technical Papers. vol. 43. No. 1. Blackwell Publishing Ltd, 2012.*

International Search Report dated Jun. 17, 2014, issued in counterpart application No. PCT/JP2014/055824 (2 pages).

* cited by examiner

Primary Examiner — John M Mauro
(74) Attorney, Agent, or Firm — Westerman, Hattori, Daniels & Adrian, LLP

(57) ABSTRACT

The present invention provides an organic thin film and an organic transistor having high performance stability and mobility. Specifically, there are provided an organic thin film including a compound containing a charge transporting molecular unit A having a structure of an aromatic fused ring system and a unit B serving as a side chain, the compound having a bilayer structure; an organic semiconductor device including the organic thin film; and an organic transistor including the organic thin film used as an organic semiconductor layer.

7 Claims, 6 Drawing Sheets

ORGANIC THIN FILM, AND ORGANIC SEMICONDUCTOR DEVICE AND ORGANIC TRANSISTOR USING SAME

TECHNICAL FIELD

The present invention relates to an organic thin film which results from a liquid crystal substance, having a high-order structure, and can be appropriately used for various devices, and an organic semiconductor device and an organic transistor including the thin film.

BACKGROUND ART

Organic substances capable of transporting electronic charges with positive holes or electrons can be used as organic semiconductors and can be used as materials for organic electronic devices, such as photoreceptors for copiers, optical sensors, organic electroluminescent (EL) devices, organic transistors, organic solar cells, and organic memory devices.

Such materials are typically used in the form of amorphous thin films or polycrystalline thin films. Thin-film transistors composed of amorphous silicon or polycrystalline silicon are widely used as switching elements for use in, for example, liquid crystal display devices and organic EL display devices. However, these transistors composed of silicon are produced with expensive production facilities. Furthermore, such transistors are formed by deposition at high temperatures and thus cannot be formed on plastic substrates having low heat resistance. To solve this problem, organic transistors including channel semiconductor layers composed of organic semiconductors in place of silicon semiconductors are reported.

In general, organic semiconductors have low carrier mobility, compared with that of silicon semiconductors, thereby reducing the response speeds of transistors. This is a problem in practical use. In recent years, organic semiconductors with mobility equivalent to amorphous silicon have been developed. For example, PTLs 1 and 2 describe compounds each having 2,7-substituted [1]benzothieno[3,2-b][1]benzothiophene skeleton (hereinafter, [1]benzothieno[3,2-b][1]benzothiophene is abbreviated as "BTBT") and state that the compounds have mobility equivalent to or higher than that of amorphous silicon.

However, the mobility is still insufficient to drive high-definition liquid crystal display devices and organic EL devices. Furthermore, even in the case of TFTs produced under the same conditions, the TFTs have large variations in mobility and thus have low performance reliability. Therefore, organic semiconductors are required to have higher mobility and performance stability when used for TFTs.

In recent years, it has been found that liquid crystal phases of liquid crystal substances, which have heretofore been considered as ion conductive substances, have significantly higher mobility than those of amorphous organic semiconductors. This finding has demonstrated that liquid crystal phases are usable as organic semiconductors.

Liquid crystal substances form molecular condensed phases (liquid crystal phases) oriented in a self-organized manner and are positioned as new types of organic semiconductors with high mobility ($10^{-4}$ cm$^2$/Vs to 1 cm$^2$/Vs). Furthermore, liquid crystal substances have been found to exhibit excellent properties in which orientation defects, such as domain boundaries and disclination, characteristic of liquid crystals are less likely to form an electrically active level, the properties being not achieved by conventional amorphous organic semiconductor materials or crystalline organic semiconductor materials. In fact, electronic devices including organic semiconductors composed of liquid crystal phases, for example, optical sensors, photoreceptors for copiers, organic EL devices, organic transistors, and organic solar cells, are produced on an experimental basis.

A prominent characteristic of liquid crystal substances is that the control of molecular orientation, which is generally difficult for non-liquid crystal substances, can easily be performed in liquid crystal phases. For example, regarding rod-like liquid crystal substances, when such a liquid crystal substance is injected into the gap between two substrates as in the case of a liquid crystal cell, in general, the liquid crystal molecules tend to be easily oriented in a state in which the long axis of each of the molecules lies in parallel with surfaces of the substrates at a liquid crystal phase temperature. When such a liquid crystal substance is applied to a substrate, the liquid crystal molecules tend to be easily oriented in a state in which the long axis of each of the molecules lies perpendicularly to a surface of the substrate. In the case of using this characteristic, a thin film (crystal thin film) having controlled molecular orientation in a crystal phase is easily produced by lowering the temperature of a liquid crystal thin film oriented at a liquid crystal phase temperature to cause a phase transition to a crystal phase, as in the case of a liquid crystal phase. In ordinary non-liquid crystalline organic materials, it is difficult to achieve the foregoing orientation control.

It has been reported that when a liquid crystal thin film composed of a liquid crystal substance (a thin film in a state of being a liquid crystal phase) is used as a precursor in forming a crystal thin film by taking advantage of the foregoing features, a crystal thin film having excellent crystallinity and flatness can be produced.

Specifically, a uniform film having excellent surface flatness is produced by forming a liquid crystal film at a liquid crystal phase temperature and cooling the resulting liquid crystal film to a crystallization temperature. Thus, liquid crystal substances are materials highly adaptable to organic semiconductors in the fact that liquid crystal substances can be used for electronic devices as organic semiconductor materials in the form of crystal thin films as well as liquid crystal thin films (for example, Non-Patent Literature 1).

In the case where a liquid crystal substance is used as an organic semiconductor, key factors are what kind of crystalline state of a thin film should be formed, in addition to the preparation of the liquid crystal substance with high electron mobility.

Hitherto, various materials have been synthesized as liquid crystal substances. However, most of targets thereof have been limited to nematic liquid crystals to be used as display materials for display devices using optical anisotropy. Thus, a guideline for the molecular design of a liquid crystal substance suitable when the liquid crystal substance is used as an organic semiconductor, in other words, a way of thinking in which the liquid crystal substance may be synthesized, has never been clarified.

In light of the foregoing circumstances, Patent Literature 3 describes a design guideline for the production of a liquid crystal substance with high mobility. Even if such a liquid crystal substance is used, it is still not clear qualitatively and quantitatively what kind of crystalline state of an organic thin film should be produced in order to produce an organic transistor with both of high mobility and high performance stability. There are problems with the development of an organic thin film and an organic transistor with mobility and performance stability.

CITATION LIST

Patent Literature

PTL 1: International Publication No. WO2006-077888
PTL 2: International Publication No. WO2008-047896
PTL 3: International Publication No. WO2012-121393 Non Patent Literature
NPL 1: Advanced Materials, electronic edition, 25 Feb. 2011, DOI: 10.1002/adma. 201004474

SUMMARY OF INVENTION

Technical Problem

It is an object of the present invention to provide and to provide an organic thin film and an organic transistor which solve the foregoing problems encountered in the related art and which have both of high performance stability and mobility.

Solution to Problem

The inventors have conducted intensive studies and have found that the foregoing problems are solved by an organic thin film having a bilayer structure of a compound containing a specific charge transporting molecular unit A and a unit B serving as a side chain.

The organic thin film of the present invention is based on the finding described above and more specifically, results from a liquid crystal substance including a charge transporting molecular unit A with a structure of an aromatic fused ring system and a unit B serving as a side chain, the liquid crystal substance exhibiting a phase other than a N phase, a SmA phase, or a SmC phase, and the organic thin film having a bilayer structure.

According to the findings of the inventors, the reason the organic semiconductor material described above exhibits suitable characteristics may be presumed as follows.

In general, liquid crystal substances are categorized into high-molecular-weight liquid crystals and low-molecular-weight liquid crystals. In the case of a high-molecular-weight liquid crystal, a liquid crystal phase generally has high viscosity, so that ionic conduction is less likely to occur. In the case of a low-molecular-weight liquid crystal, when an ionized impurity is present, ionic conduction tends to be induced in a low-order liquid crystal phase, such as a nematic phase (N phase), a smectic A phase (SmA phase, hereinafter, abbreviated in the same manner), and a SmC phase, having a strong liquid property. The term "ionized impurity" used herein indicates an ionization product formed by the dissociation of an ionic impurity or formed by photoionization or charge trapping of an electrically active impurity that can be a trap for a charge (i.e., an impurity in which one or both of the HOMO level and the LUMO level thereof have a level between the HOMO and LUMO levels of the liquid crystal substance) (for example, see M. Funahashi and J. Hanna, Impurity effect on charge carrier transport in Smectic liquid crystals, Chem. Phys. Lett., 397, 319-323 (2004), H. Ahn, A. Ohno, and J. Hanna, Detection of Trace Amount of Impurity in Smectic Liquid Crystals, Jpn. J. Appl. Phys., Vol. 44, No. 6A, 2005, pp. 3764-37687).

In the case where a liquid crystal thin film composed of a low-molecular-weight liquid crystal substance is used as an organic semiconductor, regarding the nematic phase that does not have ordered molecular alignment and the smectic liquid crystal substance that forms a molecular aggregation layer as described above, the SmA phase and the SmC phase, which do not have ordered molecular alignment in their molecular layers, have high flowability. Thus, ionic conduction is easily induced. This is a serious problem when the substances are used as organic semiconductors. In contrast, "a liquid crystal phase other than the N phase, the SmA phase, or the SmC phase", the liquid crystal phase having ordered molecular alignment in its molecular layer, i.e., a high-order smectic phase (SmB, $SmB_{cryst}$, SmI, SmF, SmE, SmJ, SmG, SmK, SmH, or the like), is characterized in that ionic conduction is less likely to be induced in this respect (this feature is advantageous when the liquid crystal phase is used as an organic semiconductor). The liquid crystal phase typically has high mobility, compared with low-order liquid crystal phases, because of its high orientational order (see H. Ahn, A. Ohno, and J. Hanna, "Impurity effects on charge carrier transport in various mesophases of Smectic liquid crystal", J. Appl. Phys., 102, 093718 (2007)).

From studies of charge transport properties of liquid crystal phases of various liquid crystal substances, it has been elucidated that in liquid crystal substances having the same core structure, higher-order liquid crystal phases with more ordered molecular alignment in their smectic phases exhibit higher mobility. Also from the viewpoints of inhibiting ionic conduction and achieving high mobility, a liquid crystal substance that exhibits a higher-order smectic phase is useful as an organic semiconductor.

In the case where a liquid crystal substance is used as an organic semiconductor in the form of a crystal thin film, in a liquid crystal substance that exhibits a low-order liquid crystal phase (the N phase, the SmA phase, or the SmC phase) having a strong liquid property in a temperature region immediately above a crystal phase, when a device is heated to a temperature higher than a temperature at which the liquid crystal phase appears, a serious problem arises in which the device is broken by the heat because of flowability. In contrast, in a liquid crystal substance that exhibits a high-order smectic phase having ordered molecular alignment in a molecular layer in a temperature region immediately above a crystal phase, also in the case of heating a device to a liquid crystal temperature, the device is less likely to break because of low flowability. Thus, also in the case where a crystal thin film composed of a liquid crystal substance serving as an organic semiconductor is used for an electronic device, a liquid crystal substance that exhibits a high-order liquid crystal phase is required (however, only in this case, a substance that exhibits a metastable crystal phase may be used in place of the liquid crystal phase). In other words, a liquid crystal substance that exhibits a liquid crystal phase other than a low-order liquid crystal phase (the N phase, the SmA phase, or the SmC phase) having a strong liquid property and a substance that exhibits a metastable phase can be suitably used in the present invention.

In general, in a substance that exhibits a plurality of liquid crystal phases or mesophases, the following is well known: The molecular alignment of a liquid crystal phase is ordered with decreasing temperature. Thus, in the liquid crystal substance, a low-order liquid crystal phase (the N phase, the SmA phase, or the SmC phase) having a strong liquid property appears in a high temperature region. A high-order liquid crystal phase or a metastable crystal phase having the highest orientational order appears in a temperature region adjacent to a crystal phase temperature. In the case where a liquid-crystal-phase thin film is used as an organic semiconductor material, a phase other than the low-order liquid crystal phase having a strong liquid property may be used in principle as an organic semiconductor. Thus, a condensed phase that appears in a temperature region adjacent to a crystal phase may suffice as long as it is not the low-order liquid crystal phase (the N phase, the SmA phase, or the SmC phase) having a strong liquid property. In the case of a liquid crystal substance that exhibits another high-order liquid crystal phase in addition to the low-order liquid crystal phase (the N phase, the SmA phase, or the SmC phase) having a strong liquid property, the control of molecular orientation in the low-order liquid crystal phase is easier than that in the high-order liquid crystal phase because the low-order liquid crystal phase has a strong liquid property. The molecules are allowed to be oriented in the low-order liquid crystal phase. Then the substance undergoes a phase transition to the high-order liquid crystal phase, thereby providing a liquid crystal thin film that exhibits low fluctuations in molecular orientation and has fewer orientational defects. This should lead to higher quality of the liquid crystal thin film and a crystal thin film.

Advantageous Effects of Invention

According to the present invention, the use of the foregoing liquid crystal substance provides an organic thin film having high performance stability as well as high mobility.

DESCRIPTION OF EMBODIMENTS

Figure 1:
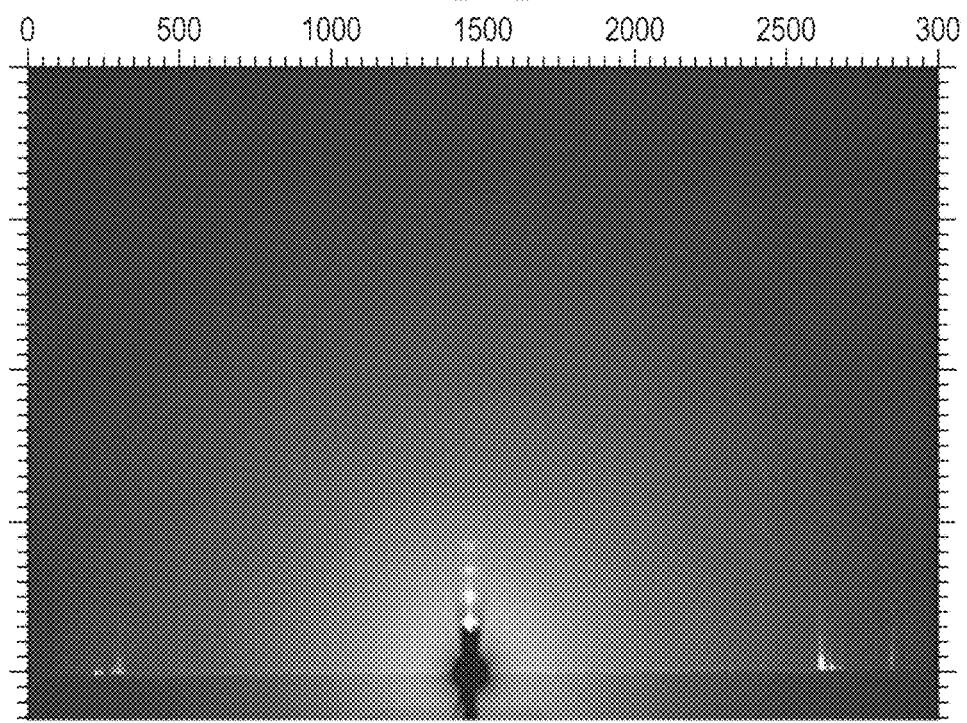
FIG. 1 is the measurement result of an organic thin film according to the present invention at Spring 8, the organic thin film having a bilayer structure illustrated in Example 1.

The present invention will be more specifically described below with reference to the drawings, as needed. In the following description, "parts" and "%" that indicate quantitative ratios are based on mass unless otherwise specified.

Specifically, the present invention includes items described below.

(I) An organic thin film includes a compound containing a charge transporting molecular unit A having a structure of an aromatic fused ring system; and a unit B serving as a side chain, in which the compound has a bilayer structure.

(II) In the organic thin film described in (I), the compound further contains a hydrogen atom, a halogen, a lower alkyl group having 1 to 4 carbon atoms, or a cyclic structure unit C linked to the charge transporting molecular unit A by a single bond.

(III) In the organic thin film according to claim 1 or 2, the compound containing the charge transporting molecular unit A having a structure of an aromatic fused ring system and the unit B serving as a side chain is a liquid crystal compound.

(IV) In the organic thin film described in any one of (I) to (III), the compound described in any one of (I) to (III) exhibits a phase other than a N phase, a SmA phase, or a SmC phase.

(V) In the organic thin film described in any one of (I) to (IV), the "phase other than the N phase, the SmA phase, or the SmC phase" is a liquid crystal phase selected from the group consisting of SmB, SmBcrystal, SmI, SmF, SmG, SmE, SmJ, SmK, and SmH.

(VI) In the organic thin film described in any one of (I) to (V), the number (NA) of fused rings in the charge transporting molecular unit A is 3 or more and 5 or less.

(VII) In the organic thin film described in any one of (I) to (VI), each of the rings constituting the fused rings in the charge transporting molecular unit A is a ring having 5 to 6 carbon atoms.

(VIII) In the organic thin film described in any one of (II) to (VII), the number (NC) of rings in the cyclic structure unit C and the number (NA) of fused rings in the charge transporting molecular unit A satisfy the following relationship:

(IX) In the organic thin film described in any one of (I) to (VIII), the charge transporting molecular unit A is represented by the general formula (1):

[Chem. 1]

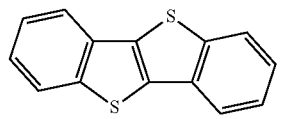

(1)

(X) In the organic thin film described in any one of (I) to (IX), the unit B serving as a side chain is an optionally substituted alkyl group having 2 to 20 carbon atoms, an optionally substituted alkenyl group having 2 to 20 carbon atoms, an alkyloxy group having 2 to 20 carbon atoms, an alkylthio group having 2 to 20 carbon atoms, or a group represented by the general formula (2):

[Chem. 2]

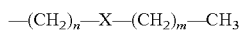

(2)

(wherein in the formula, X represents S, O, or NH, m represents an integer of 0 to 17, and n represents an integer of 2 or more).

(XI) In the organic thin film described in any one of (II) to (X), the cyclic structure unit C is a unsubstituted aromatic hydrocarbon group, an aromatic hydrocarbon group substituted with a halogen or a lower alkyl group having 1 to 4 carbon atoms, an unsubstituted heteroaromatic group, a heteroaromatic group substituted with a halogen or a lower alkyl group having 1 to 4 carbon atoms, or represented by (3) or (4):

[Chem. 3]

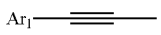

(3)

[Chem. 4]

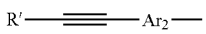

(4)

(wherein $Ar_1$ represents an unsubstituted aromatic hydrocarbon group, an aromatic hydrocarbon group substituted with a halogen or a lower alkyl group having 1 to 4 carbon atoms, an unsubstituted heteroaromatic group, or a heteroaromatic group substituted with a halogen or a lower alkyl group having 1 to 4 carbon atoms, $Ar_2$ represents an optionally substituted aromatic hydrocarbon group, R' represents an unsubstituted aromatic hydrocarbon group, an aromatic hydrocarbon group substituted with a halogen or a lower alkyl group having 1 to 4 carbon atoms, an unsubstituted heteroaromatic group, or a heteroaromatic group substituted with a halogen or a lower alkyl group having 1 to 4 carbon atoms).

(XII) A method for producing an organic thin film described in any one of (I) to (XI) includes a step of subjecting the organic thin film to annealing.

(XIII) An organic semiconductor device includes the organic thin film described in any one of (I) to (XI).

(XIV) An organic transistor includes the organic thin film described in any one of (I) to (XI), the organic thin film being used as an organic semiconductor layer.

(XV) An organic semiconductor device includes an organic thin film produced by the method for producing an organic thin film described in (XII).

(XVI) An organic transistor includes an organic thin film produced by the method for producing an organic thin film described in (XII), the organic thin film being used as an organic semiconductor layer.

(Bilayer Structure)

The bilayer structure of an organic thin film according to the present invention will be described.

The bilayer structure of the present invention indicates a bimolecular layer-like structure in which two charge transporting molecular units A face each other to form a pair, thereby forming a paired layer. The formation of the pair of the two charge transporting unit A relatively delocalizes the π-cloud to increase the mobility. Furthermore, the bilayer structure is formed into a continuously grown crystal by the self-organizing ability of a liquid crystal substance, thereby providing an organic thin film with fewer charge transfer defects, i.e., with high performance stability.

The bilayer structure of the present invention may be identified by synchrotron X-ray scattering measurement. The synchrotron X-ray scattering measurement used here includes small angle X-ray scattering and wide angle X-ray scattering.

Small angle X-ray scattering is a technique for obtaining the structural information of a substance by measuring X-rays scattered at small scattering angles when the substance is irradiated with X-rays, the technique being used to evaluate the size, shape, regularity, and dispersity in the internal structure. A smaller scattering angle indicates a larger size of a corresponding structure.

Wide angle X-ray scattering is a technique for obtaining information on the structure of a substance by measuring X-rays scattered at large scattering angles when the substance is irradiated with X-rays. Wide angle X-ray scattering provides information on a small structure, compared with that obtained by small angle X-ray scattering. In addition to a crystal structure analysis and so forth, information on the degree of orientation of a sample is also obtained.

Small angle X-ray scattering measurement and wide angle X-ray scattering measurement may be performed with commercially available general-purpose X-ray apparatuses. An organic thin film having a small area and a thickness of 100 nm or less for use in an organic transistor is preferably subjected to small angle X-ray scattering measurement and wide angle X-ray scattering measurement with synchrotron X-rays in a large synchrotron radiation facility, such as a large synchrotron radiation facility SPring-8.

SPring-8 is a large synchrotron radiation facility which delivers the most powerful synchrotron radiation in the world and located in Harima Science Park City, Hyogo Prefecture. Synchrotron radiation, which consists of narrow, powerful beams of electromagnetic radiation, is produced when electrons are accelerated to a speed substantially equal to the speed of light and then forced to travel in a curved path by magnets.

In small angle X-ray scattering measurement and wide angle X-ray scattering measurement, higher-intensity X-rays enables the measurement to be performed in a shorter period of time. The intensity of synchrotron X-rays from SPring-8 is 100 million or more times than those of X-rays from commercially available general-purpose X-ray apparatuses. Even in the case of measuring an ultrathin film with an ultrasmall area, sufficient intensity is obtained.

An example of synchrotron X-ray scattering measurement will be described below.

An organic thin film of the present invention was measured with a first hatch of beamline BL03XU owned by Frontier Soft Matter Beamline Consortium in high-intensity synchrotron radiation experimental facility SPring-8 under conditions as follows: measurement mode: Grazing Incident Small Angle Scattering/Wide Angle Scattering, GISAXS/WAXS, camera length: 140 mm and 2300 mm, wavelength: 0.1 nm, X-ray incident angle: 0.08° or 0.16°, exposure time: 1 to 5 seconds, measured temperature: 25° C., scattering angle range: 2θ=0.1° to 20°, and so forth.

The resulting two-dimensional X-ray scattering image was analyzed by a method described below to determine the structure of the thin film. The center position of a reflected X-ray beam in the two-dimensional scattering image was determined from the X-ray incident angle at the time of measurement. Scattering-diffraction intensity I on a straight line in the horizontal direction when viewed from the center of the reflected beam was measured. A one-dimensionalized scattering profile H as scattering intensity I with respect to a scattering angle 2θ from the center of the reflected beam was obtained. Similarly, scattering-diffraction intensity I on a straight line in the upward vertical direction when viewed from the center of the reflected beam was measured. A one-dimensionalized scattering profile V as scattering intensity I with respect to a scattering angle 2θ from the center of the reflected beam was obtained. We focused on the highest-intensity peak in each of the scattering profiles H and V. A periodic length d [nm] was calculated from the expression $2d \sin(2\theta/2) = \lambda$ using the scattering angle 2θ at the position of the peak, where λ [nm] denotes an X-ray wavelength of 0.1 nm.

From the scattering profile H, a periodic length of about 4 Å and so forth originating from a periodic structure (interplanar spacing) in a direction substantially orthogonal to a molecular chain in the alignment structure of target molecules were calculated. From the scattering profile V, a periodic length of about 30 Å originating from the molecular length of a compound was calculated. From the measurement principle of GISAXS/WAXS, information on the in-plane periodic structure of the thin film is obtained from the scattering profile H. Information on a periodic structure in a stacked state of the thin film is obtained from the scattering profile V. From a diffraction profile characteristic of a high-order smectic phase and the structural features of the liquid crystal phase, it was found that the organic thin film had a bilayer structure in which compound molecules were arranged perpendicularly to a substrate and stacked every about 30 Å corresponding to a molecular length.

In the present invention, in the case where the compound containing the charge transporting molecular unit A with a structure of an aromatic fused ring system and the unit B serving as a side chain is a liquid crystal compound, the compound is more preferably used. The reason for this is that a liquid crystal substance, in particular, a smectic liquid crystal substance, forms a condensed phase (smectic liquid crystal phase) with a layer structure in a self-organizing manner and thus a large-area uniform crystal film having excellent surface smoothness can be easily produced using the liquid crystal substance as a precursor to form a crystal phase. The liquid crystal substance exhibits a liquid crystal phase and thus heat treatment can be performed at a liquid crystal phase temperature. This is also an advantage over non-liquid crystal substances. Among smectic liquid crystal substances, liquid crystal compounds that exhibit liquid crystal phases described below are particularly preferred.

(Predetermined Liquid Crystal Phase)

In the present invention, "the liquid crystal phase other than the N phase, the SmA phase or the SmC phase" is preferably a liquid crystal phase selected from the group consisting of SmB, $SmB_{cryst}$, SmI, SmF, SmE, SmJ, SmG, SmK, and SmH. The reason for this is as follows: In the case where a liquid crystal substance according to the present invention is used as an organic semiconductor in the form of a liquid crystal phase, as previously mentioned, these liquid crystal phases have low flowability and thus are less likely to cause ionic conduction. Furthermore, these liquid crystal phases have high orientational order of molecules; hence, high mobility should be provided in the liquid crystal phases. In the case where the liquid crystal substance according to the present invention is used as an organic semiconductor in the form of a crystal phase, these liquid crystal phases have low flowability, compared with the N phase, the SmA phase, and the SmC phase. Thus, even in the case where the liquid crystal substance undergoes a phase transition to a liquid crystal phase by an increase in temperature, a device is less likely to break. In the case where the liquid crystal phase appears only in a temperature drop process, once crystallization occurs, the crystal temperature range is extended. Thus this is advantageous when the liquid crystal substance is used in the form of a crystal phase. In the present invention, "the phase other than the N phase, the SmA phase, or the SmC phase" is characterized by being $SmB_{cryst}$, SmE, SmF, SmI, SmJ, SmG, SmK, or SmH in a temperature drop process.

Among "the liquid crystal phases other than the SmA phase or the SmC phase", SmE and SmG, which are higher-order Sm phases, are particularly preferred as liquid crystal phases that appear in a temperature region adjacent to the liquid crystal phases when the temperature of the organic semiconductor material is increased from a crystal phase. In a liquid crystal substance that exhibits a high-order liquid crystal phase in addition to a low-order liquid crystal phase (for example, the N phase, the SmA phase, or the SmC phase) having a strong liquid property, since the low-order liquid crystal phase has a strong liquid property, the control of molecular orientation is easier than that in the high-order liquid crystal phase. Thus, molecules are oriented in advance in the low-order liquid crystal phase, and then the liquid crystal substance undergoes a phase transition to the high-order liquid crystal phase, thereby providing a liquid crystal thin film with only small fluctuations in molecular orientation and fewer orientation defects. It is thus possible to achieve higher quality of a liquid crystal thin film and a crystal thin film.

In the case where a liquid crystal substance is used as an organic semiconductor, the operating temperature required for a device including the liquid crystal substance is usually −20° C. to 80° C. Thus, in the present invention, it is necessary that a temperature region at which "the phase other than the N phase, the SmA phase, or the SmC phase" appears should be −20° C. or higher. In the case where a liquid crystal substance according to the present invention is used as an organic semiconductor in the form of a crystal phase, the use of a thin film in the liquid crystal state (liquid crystal thin film) as a precursor for the preparation of a crystal thin film is effective in achieving higher quality of the crystal thin film. For this reason, in view of the simplicity of a process and the ease of selection of a substrate, the temperature at which a liquid crystal phase of the liquid crystal substance appears is preferably 200° C. or lower.

(Organic Semiconductor Material)

An organic semiconductor material that may be used in the present invention is an organic semiconductor material including a charge transporting molecular unit A with a structure of an aromatic fused ring system and the unit B serving as a side chain, and is preferably an organic semiconductor material further containing a hydrogen atom, a halogen, a lower alkyl group having 1 to 4 carbon atoms, or a cyclic structure unit C linked to the unit A by a single bond.

(Preferred Charge Transporting Molecular Unit A)

In an organic semiconductor, a molecular moiety that contributes to charge transport is a conjugated π-electron system unit including an aromatic ring and so forth. In general, a larger size of the conjugated π-electron system is advantageous to charge transport. However, a larger size of the conjugated π-electron system reduces the solubility in an organic solvent and results in a high melting point. Thus, a problem arises in which it is difficult to perform a process of synthesis or use as an organic semiconductor. Hence, the number of fused rings in the charge transporting molecular unit is preferably 3 or more and 5 or less. The charge transporting molecular unit A may contain a heterocycle. Each of the rings constituting the fused rings preferably has 5 or 6 carbon atoms (i.e., a 5-membered ring or a 6-membered ring) for convenience of synthesis.

The heterocycle included in the charge transporting molecular unit A is also preferably a 5-membered ring or a 6-membered ring. The number of heterocycles is not preferably limited. Preferably, the number of heterocycles is as follows.

| \<Number of rings in unit A\> | \<Number of heterocycles\> |
|---|---|
| 3 | 1 |
| 4 | 1 or 2 |
| 5 | 1 to 3 (particularly, 1 or 2) |

In the case of selecting a compound constituting the unit A from the viewpoint of developing a high-order liquid crystal phase, the melting point may be used as a guide. This is because the melting point gives an index of the cohesive energy of the compound. A compound with a high melting point exhibits a strong intermolecular interaction at the time of aggregation and is easily crystallized. Such a compound advantageously induces the development of a high-order liquid crystal phase. Thus, the compound constituting the unit A (the compound on the assumption that the compound is not linked to the unit B or the unit C) preferably has a melting point of 120° C. or higher, more preferably 150° C. or higher, still more preferably 180° C. or higher, and particularly preferably 200° C. or higher. A melting point of 120° C. or lower is liable to cause the development of a low-order liquid crystal phase, which is not preferred.

The compound constituting the unit A will be specifically described below by specific examples.

In the case where a target compound is represented by the following formula (5), a compound constituting the unit A is a compound represented by the following formula (1), where a single bond connected to the unit C is removed, and a hydrogen atom is substituted for the position of the unit A to which the unit C is connected by the single bond.

[Chem. 5]

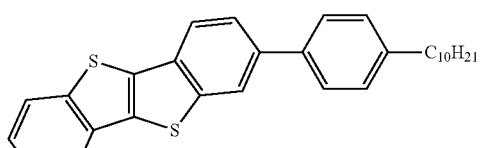

(5)

[Chem. 6]

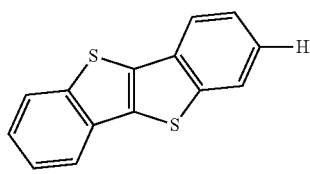

(1)

In this example, the compound constituting the unit A is benzothieno[3,2-b][1]benzothiophene. The melting point of benzothieno[3,2-b][1]benzothiophene is the melting point of the compound constituting the unit A.

In this example, a single bond has been present between the unit A and the unit B. Also in the case where a single bond is formed with the unit C, the melting point of the compound constituting the unit A may be specified in the same manner.

The number of repetitions of the unit A may be 1 or 2.
(Preferred Cyclic Structure Unit C)

In the present invention, the unit C is "another structure" moiety that allows the degree of freedom of a flip-flop movement. The unit C is preferably an aromatic fused ring or alicyclic molecular structure linked to the charge transporting unit A by a single bond. The number of rings is preferably 1 or more and 5 or less (more preferably, 3 or less, and particularly preferably 1 or 2).

The number of rings in the unit C is not particularly limited. When the number of rings included in the unit A is represented by "NA" and when the number of rings included in the unit C is represented by "NC", NA≥NC is preferred. More specifically, the number of rings is preferably as follows.

| \<Number of rings in unit A\> | \<Number of rings in unit C\> |
|---|---|
| 3 | 1 to 3, more preferably 1 or 2 (particularly preferably 1) |
| 4 | 1 to 4, more preferably 1 to 3 (particularly preferably 1 or 2) |
| 5 | 1 to 5, more preferably 1 to 4 (particularly preferably 1 to 3) |

The unit C may contain a heterocycle. The heterocycle is preferably a 5-membered ring or a 6-membered ring.

The unit C is preferably, for example, an aromatic compound, an aromatic fused-ring compound, a cycloalkane, a cycloalkene, or a heteroatom-containing alicyclic saturated compound, whose specific examples are listed below. In the case of the cycloalkene, cyclopentene, which is considered to have higher planarity than that of cyclohexene, is preferred. In the present invention, the unit A and the unit C are required to be directly linked to each other by a single bond.
(Unit B)

The unit B may be linked to, for example, the unit A or the unit C. In the case of using the unit B in the form of a crystal thin film, the unit B is preferably linked to "one of" the unit A and the unit C from the viewpoint of extending the crystal temperature region. The unit B is preferably a compound having a linear structure, such as a hydrocarbon or a heteroatom-containing saturated compound, and particularly preferably, a hydrocarbon having 2 to 20 carbon atoms or a group represented by the general formula (2):

[Chem. 7]

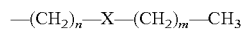

—(CH$_2$)$_n$—X—(CH$_2$)$_m$—CH$_3$    (2)

(wherein in the formula, X represents S, O, or NH, m represents an integer of 0 to 17, and n represents an integer of 2 or more).

The unit B that is present as a side chain attached to at least one of the unit A and the unit C is preferably located at a position that is not adjacent to a position at which the cyclic structure (A or C) to which the unit B is attached is linked or fused with another cyclic structure (i.e., C or A). An example of the linking position is an exemplified structure illustrated below.

Regarding the linking position of the unit B, let us give an explanation using a specific compound used for an organic semiconductor material of the present invention. For example, in the case of the following formula (5), the unit A is benzothieno[3,2-b][1]benzothiophene, the unit C is a phenyl group, and the unit B is C$_{10}$H$_{21}$. The unit A, benzothieno[3,2-b][1]benzothiophene, and the unit B, C$_{10}$H$_{21}$, are attached to the para-positions of benzene of the unit C.

[Chem. 8]

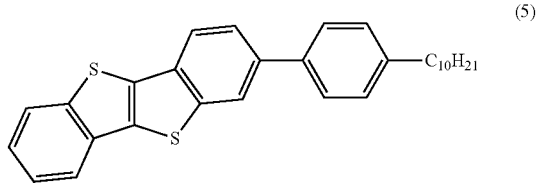

(5)

Regarding a compound containing another unit according to the present invention, the linking position may be represented in the same manner.

In the case where two cyclic compounds are linked by a single bond, when a substituent or a sterically-bulky structure is present near the linking position, the rotational motion about an axis of two compounds is inhibited by the interaction of the substituent or the sterically-bulky structure. This results in fluctuations in the conformation of condensed molecules and an increase in reorganization energy that affects the charge transfer rate between molecules. Thus, in a liquid crystal substance having such a molecular structure, even if a high-order liquid crystal phase is developed, the charge transport properties are often degraded.

As described above, the number of repetitions of the unit A may be 1 or 2. Like compound 58, the entire structure of the compound may be repeated. In this case, the number of repetitions may be 1 or 2.

(Point of Molecular Design)

In the present invention, in order to produce a liquid crystal substance with high mobility, molecular design is preferably performed in consideration of the following points.

(1) In the present invention, as a factor governing the charge transfer rate in a liquid crystal phase or a crystal phase in which molecules are oriented, it is important that a value of the transfer integral of a π-electron system molecular unit be large. To actually calculate the value by a quantum-chemical method, it is necessary to determine the specific molecular configuration between adjacent molecules in a target molecular condensed state and to perform a calculation. Comparatively speaking, a molecular structure with a redundantly extended π-electron system is advantageous over fluctuations in relative molecular position.

In the case of a smectic liquid crystal substance, a rod-like π-electron conjugated system with a large size to some extent is selected for the charge transporting molecular unit having a π-electron conjugated system serving as a charge transport site. In this case, a molecular unit including a large π-electron conjugated system that has a fused ring structure is used without using a molecular unit in which a plurality of small aromatic rings, such as benzene or thiophene, are linked by a single bond to form a large π-electron conjugated system, which is often used as a liquid crystal molecular structure. The number of rings in the fused rings structure is preferably 3 or more and practically 5 or less because an excessively large number of rings results in a decrease in solubility in a solvent.

In the present invention, an aromatic π-electron conjugated system fused ring structure is preferably a structure in which benzene, pyridine, pyrimidine, thiophene, thiazole, imidazole, or furan is used as an aromatic ring structure and these rings are fused to form a rod-like three-, four-, or five-ring structure.

(2) In the present invention, in order to achieve high mobility, it is necessary to develop a high-order liquid crystal phase. It is generally considered that regarding smectic liquid crystal phases, the molecular motion of a liquid crystal molecule is gradually frozen as a phase transition occurs from the SmA phase or the SmC phase, whose molecular arrangement is not ordered in a molecular layer, to a high-order liquid crystal phase, and in the highest-order SmE phase, SmG phase, or the like, a flip-flop movement (sometimes referred to as "flapping motion") of a molecule is ultimately left.

In consideration of this point, a structure in which the foregoing aromatic π-electron conjugated system fused ring structure is linked by at least another rigid structure through a single bond is preferably used as a main core structure included in a liquid crystal molecule. In this case, a structure having the number of rings equal to or smaller than the number of rings in the aromatic π-electron conjugated system fused ring structure is selected as the another rigid structure unit linked. The number of rings may be 1 or 2. The structure may not necessarily be a structure having an aromatic ring that includes a heterocyclic ring in a broad sense and may be an alicyclic structure, for example, cyclohexane, cyclopentane, or double bond-containing cyclohexene or cyclopentene.

(3) In the present invention, in order to develop smectic liquid crystallinity, the basic design of a rod-like liquid crystal substance is to form a substance having a structure in which a flexible hydrocarbon unit configured to provide rod-like molecular shape anisotropy and a liquid property is linked to a rigid molecular unit called a core portion and in which the units are basically arranged in a linear configuration, as described above.

The core portion used in the present invention corresponds to a structure in which at least one rigid structure is linked to the aromatic π-electron conjugated system fused ring structure through a single bond. Regarding the linking position of the unit B in the core portion, it is important to provide the rod-like anisotropy as the whole molecule. In this case, regarding the position of the unit B linked to the core portion, the unit B may be linked to one or both of the unit A and the unit C as long as the position of the unit B is remote from the single bond connecting the unit A and the unit C. Regarding the shape of the molecule including the unit B linked, it should be noted that when the structure of the whole molecule has large bending, the smectic phase is less likely to be induced.

As a rule of thumb, this molecular design may be performed on the basis of a deflection range when the molecule of the core portion rotates about the single bond, serving as an axis, between the unit B and the core portion. More specifically, an angle of the axis to a straight line is defined as $\theta$, the straight line being connected between a carbon atom to which the unit B is linked and the outermost carbon or hetero-element in the core portion of the unit A or the unit C that is not directly linked to the unit B when the molecule rotates. In the case where the angle $\theta$ is used to describe the deflection range, a structure such that the deflection range $\theta$ is preferably 90° or less, more preferably 60° or less, and still more preferably 30° or less is preferred from the viewpoint of enabling the development of the liquid crystal phase and an increase in mobility.

As another rule of thumb, preferably, the single bond between the unit A and the unit C and the single bond between the unit B and the unit A or between the unit B and the unit C are aligned or are in parallel with each other. Alternatively, the angle between the two single bonds is preferably 90° or more and more preferably 120° or more.

(Scheme 1) (a) illustrates an example in which $\theta$ is 30° or less and two single bonds are aligned with each other. (Scheme 1) (b) illustrates an example in which $\theta$ is 30° or less and two single bonds are in parallel with each other. (Scheme 2) (a) illustrates an example in which $\theta$ is 30° or more and 60° or less and the angle between two single bonds is 120°. (Scheme 2) (b) illustrates an example in which $\theta$ is 30° or more and 60° or less and the angle between two single bonds is 120° or more. (Scheme 3) (a) illustrates an example in which $\theta$ is 30° or less and two single bonds are in parallel with each other. (Scheme 3) (b) illustrates an example in which $\theta$ is 30° or less and two single bonds are aligned with each other.

(Scheme 1)
[Chem. 9]
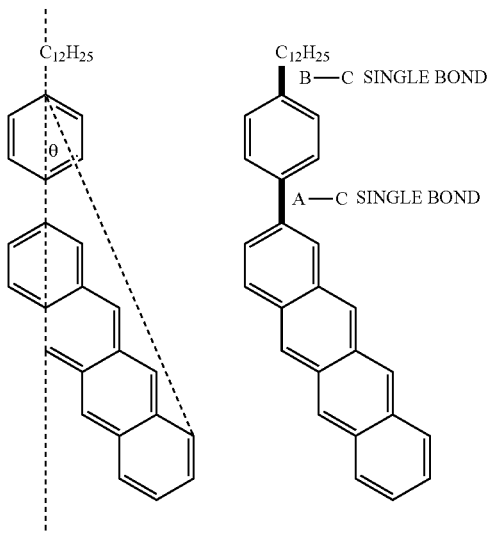
(a)
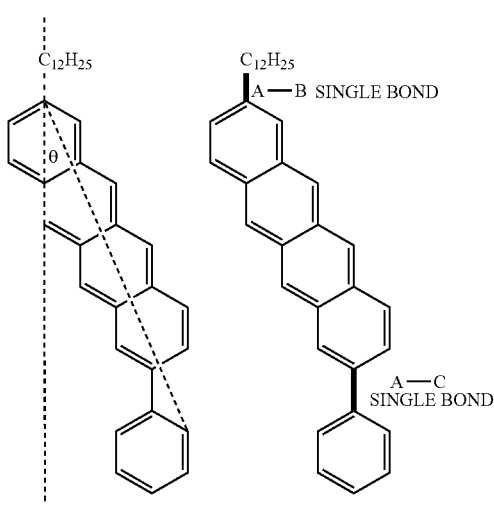
(b)
(Scheme 2)
[Chem. 10]
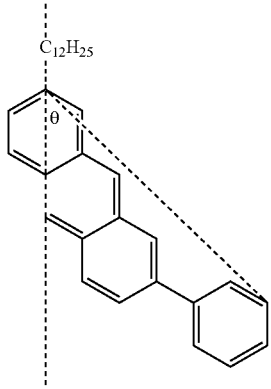
(a)
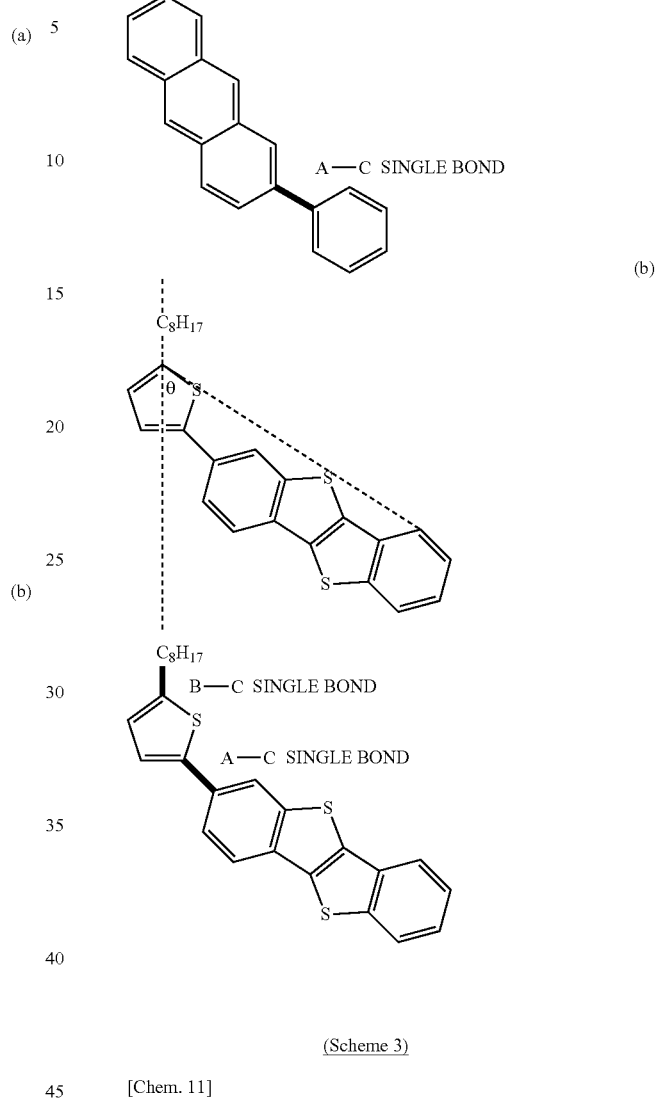
(b)
(Scheme 3)
[Chem. 11]
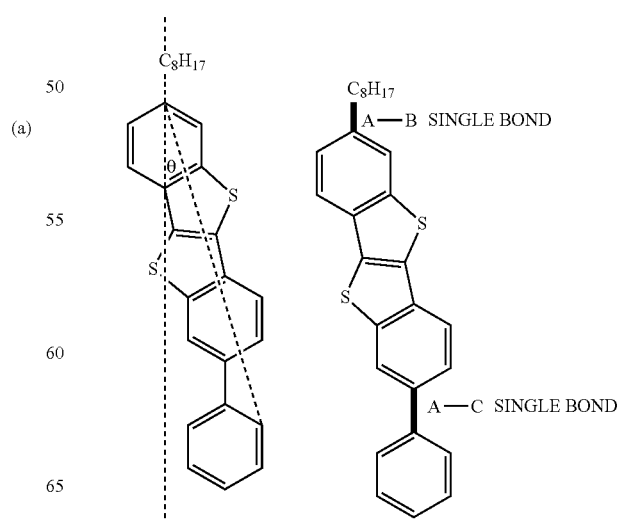
(a)

(b)

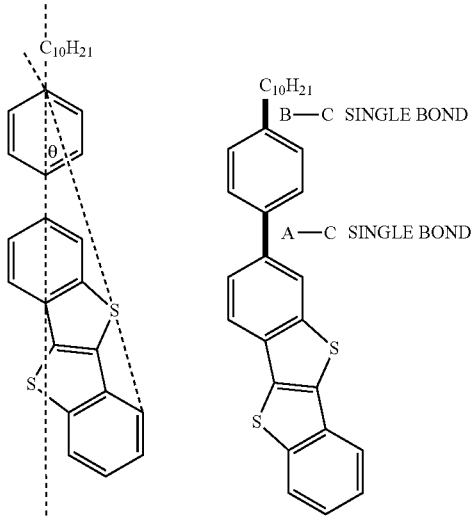

In the case of developing a liquid crystal phase, the structure of the unit B may further contain a double bond, a triple bond, or a hetero-element, for example, oxygen, sulfur, or nitrogen. However, the direct linkage of the unit B with the core portion without providing oxygen, sulfur, nitrogen, or the like therebetween is preferred in view of mobility.

(Screening Method)

In the present invention, substances which develop high-order smectic liquid crystal phases and which are useful as organic semiconductors may be determined by screening of compounds that satisfy the molecular design, as needed. In this screening, basically, in the case where a liquid crystal phase is used as an organic semiconductor, a substance is preferably selected in such a manner that a high-order smectic phase is developed. In the case where a crystal phase is used as an organic semiconductor, a substance is preferably selected in such a manner that a low-order liquid crystal phase is not developed adjacent to the crystal phase when cooling is performed from a temperature higher than a crystal phase temperature. In this selection method, a substance useful as an organic semiconductor material may be selected on the basis of evaluation according to a "screening method" described below.

Scheme A illustrates a basic concept regarding the present invention. The unit A and the unit C are called the core portion in a liquid crystal molecule. A basic design of a liquid crystal substance according to the present invention provides a substance in which the unit B (preferably, a unit having 3 or more carbon atoms) is linked to one or both of the sides of the core portion.

(Scheme A)

[Chem. 12]

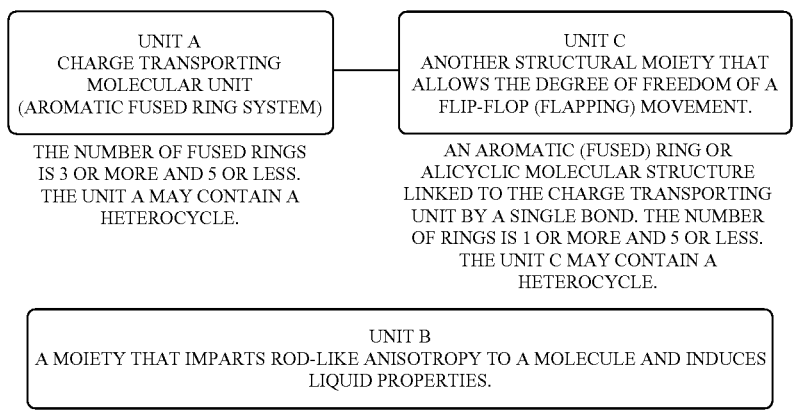

(Charge Transporting Molecular Unit)

As the charge transporting molecular unit corresponding to the core portion in a liquid crystal molecule, a molecular unit having an aromatic π-electron fused ring system with 3 or more rings is used, thereby ensuring the redundancy of the transfer integral for fluctuations in molecular position. Similarly, a molecular unit having a fused ring structure is used instead of using a π-electron conjugated molecular unit in which a plurality of benzene or thiophene molecules are linked together by a single bond, thereby fixing the molecular conformation. This should result in an increase in transfer integral and serves to improve the mobility.

In the case where a charge transporting molecular unit having a large fused ring structure is used as the core portion, a substance, for example, dialkylpentacene or dialkylbenzothienobenzothiophene, in which a hydrocarbon chain is directly linked to the core portion, does not stabilize a liquid crystal phase. Typically, the substance does not develop a liquid crystal phase. Even if a liquid crystal phase is developed, only a low-order liquid crystal phase, such as the SmA phase, is developed (Non-Patent Literatures: Liquid Crystal, Vol. 34, No. 9 (2007), 1001-1007; and Liquid Crystal, Vol. 30, No. 5 (2003), 603-610). Thus, when a large fused ring structure is simply used for the charge transporting molecular unit, it is impossible to provide high mobility in a liquid crystal phase. As illustrated in the figure, in the case where a molecular structure in which another structural unit that allows the degree of freedom of a flip-flop movement of a molecule is linked to the charge transporting molecular unit, is used for the core portion, the development of a high-order liquid crystal phase and high mobility in the liquid crystal phase should first be provided.

A hydrocarbon chain is linked to such a structure (core portion) in which the another rigid structural unit is linked to the charge transporting molecular unit, thereby imparting rod-like molecular shape anisotropy and a liquid property to the molecule. This can induce the development of a liquid crystal phase with high probability. In the case where the hydrocarbon chain is linked, two hydrocarbon chains are typically linked. Also in the case of a single hydrocarbon chain, a liquid crystal phase can often be developed. In this case, typically, there is a difference in temperature region where a liquid crystal phase appears between a temperature drop process and a temperature rise process, in many cases. This serves typically to extend a liquid crystal phase temperature region to a low temperature in the temperature drop process and to extend a crystal phase to a high temperature region in the temperature rise process. This property indicates that in the case where a polycrystalline thin film composed of a liquid crystal substance is used as an organic semiconductor, a liquid crystal thin film (thin film in a liquid crystal phase state) can be produced at a lower temperature in a process of producing the polycrystalline thin film using the liquid crystal thin film as a precursor, thereby advantageously simplifying the process. The extension of the crystal phase temperature to a high temperature region in the temperature rise process indicates that the resulting polycrystalline film has improved thermal stability, which is advantageous as a material. In the case where two hydrocarbon chains are attached, typically, a liquid crystal phase developed is stabilized and thus can be advantageously used for a device including a liquid crystal phase.

In the case where a substance is synthesized according to the basic molecular design, the utility of the substance in the present invention is basically provided by satisfying the following requirements: In the case where the substance is used as an organic semiconductor in the form of a liquid crystal phase, the substance is selected so as to develop a high-order smectic phase. In the case where the substance is used as an organic semiconductor in the form of a crystal phase, the substance is selected in such a manner that a crack and a void are less likely to be formed in a crystal thin film in cooling from a temperature higher than a crystal phase temperature and that no low-order liquid crystal phase is developed adjacent to a crystal phase. In other words, in the case where the substance is used as an organic semiconductor in the form of a liquid crystal phase, an evaluation criterion is whether a liquid crystal phase other than the nematic phase, the SmA phase, or the SmC phase is developed in a temperature region adjacent to a crystal phase. In the case where the substance is used as an organic semiconductor in the form of a crystal phase, an evaluation criterion is whether a crack and void are less likely to be formed when the substance undergoes a phase transition to a crystal phase by cooling from a temperature region higher than the crystal phase.

The evaluation can be easily made according to a screening method (evaluation method) described below. Regarding the details of measurement methods used in the screening method, we can refer to literatures described below, as needed.

Literature A: "Henko Kenbikyo no Tsukaikata (How to Use Polarizing Microscope)", Jikken Kagaku-Kou (Experimental Chemistry Course), 4th ed., Vol. 1, Maruzen, pp. 429-435.

Literature B: "Ekisho Zairyo no Hyoka (Evaluation of Liquid Crystal Materials)", Jikken Kagaku Kouza (Experimental Chemistry Course), 5th ed., Vol. 27, pp. 295-300, Maruzen.

: Ekisho Kagaku Jikken Nyumon (Manual of Liquid Crystal Science Experiments), edited by The Japanese Liquid Crystal Society, published by Sigma Shuppan (S1) An isolated test substance is purified by column chromatography and recrystallization. It is confirmed by silica gel thin-layer chromatography that the test substance exhibits a single spot (i.e., the test substance is not a mixture).

(S2) A sample is heated to exhibit an isotropic phase and then is injected into a 15-μm-thick cell by capillarity, the cell including glass slides bonded to each other with a spacer provided therebetween. The cell is once heated to an isotropic phase temperature. The texture thereof is observed with a polarizing microscope to confirm that a dark field of view is not observed in a temperature region lower than the isotropic phase. This indicates that long axes of molecules are horizontally oriented with respect to the substrate and is a requirement needed for the subsequent texture observations.

(S3) The texture is observed with the microscope while the cell is cooled at an appropriate rate of temperature drop, for example, at about 5° C./min. Here, an excessively high cooling rate results in a reduction in the size of a structure formed. In this case, it is difficult to perform detailed observation. Thus, the temperature is increased to the isotropic phase again, and the cooling rate is adjusted to determine conditions such that the structure has a size of 50 μm or more because the structure is easily observed.

(S4) The texture is observed while the cell is cooled from the isotropic phase to room temperature (20° C.) under the conditions determined in item (S3). When the sample is crystallized in the cell during the cooling, a crack or a void is formed by lattice contraction, a black line or a region with a certain size appears in the texture observed. When air is entrained during the injection of the sample, the same black region (generally, round) is locally formed. The black line or the region formed by crystallization is distributed in the texture and a boundary can easily be distinguished. They can easily be discriminated from other structures seen in the texture because even when a polarizer and an analyzer are rotated, disappearance or a change in color is not observed. A temperature at which the texture appears is defined as a crystallization temperature. It is confirmed that a texture that appears in a temperature region higher than the crystallization temperature is not the nematic phase, the SmA phase, or the SmC phase. In the case where the sample exhibits the nematic phase, a characteristic schlieren texture expressed as a bobbin-like texture is observed. In the case where the sample exhibits the SmA phase or the SmC phase, a characteristic texture called a fan-like texture which has a fan shape and a uniform structure in the region is observed. Thus, the texture can easily be identified from the characteristic texture.

As a special case, in a substance that undergoes transitions from the SmA phase to the SmB phase, from the SmC phase to the SmF phase, or from the SmC phase to the SmI phase, a change in the field of view is momentarily observed at a phase transition temperature. In some cases, substantially no change is observed in the texture that has undergone the phase transition, so careful observation is required because the texture of the formed SmB, SmF, or SmI phase can be misidentified as the SmA phase or the SmC phase. In this case, it is important to pay attention to the momentary change in the field of view at the phase transition temperature. In the case where the confirmation of the identification is needed, the number of mesophases is determined by DSC. Then X-ray diffraction is measured at respective temperature regions. The presence or absence of a peak in a high-angle region (15° to 30° in terms of 0-2θ) characteristic of each phase is checked. In this way, the SmA phase and the SmC phase (each phase exhibits no peak) can easily be discriminated from the SmB phase, the SmF phase, and the SmI phase (each phase exhibits a peak).

(S5) A substance in which a black structure is not observed by the texture observation with the polarizing microscope at room temperature (20° C.) is usable as an organic semiconductor. Regardless whether the substance exhibits a high-order liquid crystal phase or a crystal phase at room temperature (including a metastable crystal phase), the substance should be within the scope of the present invention.

From the viewpoint of using the organic semiconductor material according to the present invention for a device, the HOMO and LUMO energy levels of the core portion are also important. In general, the HOMO level and the LUMO level may be estimated as follows: A test substance is dissolved in a dehydrated organic solvent, such as dichloromethane, to a concentration of, for example, 1 mmol/L to 10 mmol/L. About 0.2 mol/L of a supporting electrolyte, such as a tetrabutylammonium salt, is added thereto. A working electrode composed of, for example, Pt, a counter electrode composed of, for example, Pt, and a reference electrode composed of, for example, Ag/AgCl are inserted into the resulting solution. Thereafter, sweeping is performed at a rate of about 50 mV/sec with a potentiostat to draw a CV curve. From a difference between the peak potential and a potential of a known substance, such as ferrocene, serving as a reference, the HOMO level and LUMO level are estimated. In the case where the HOMO level or the LUMO level deviates from the potential window of the organic solvent, the HOMO level or the LUMO level may be estimated by calculating the HOMO-LUMO level from the absorption edge of an ultraviolet-visible absorption spectrum and subtracting the calculated level from the measured level. Regarding this method, we can refer to J. Pommerehne, H. Vestweber, W. Guss, R. F. Mahrt, H. Bassler, M. Porsch, and J. Daub, Adv. Mater., 7, 551 (1995).

In general, the HOMO and LUMO levels of an organic semiconductor material are indicative of electrical contact with an anode and a cathode, respectively. We should pay attention to the levels because the charge injection is limited by an energy barrier determined by the difference in energy from the work function of an electrode material. Regarding work functions of metals, the work functions of exemplary substances that are often used for electrodes are listed below: silver (Ag): 4.0 eV, aluminum (Al): 4.28 eV, gold (Au): 5.1 eV, calcium (Ca): 2.87 eV, chromium (Cr): 4.5 eV, copper (Cu): 4.65 eV, magnesium (Mg): 3.66 eV, molybdenum (Mo): 4.6 eV, platinum (Pt): 5.65 eV, indium-tin oxide (ITO): 4.35 to 4.75 eV, and zinc oxide (ZnO): 4.68 eV. From the point of view described above, the difference in work function between the organic semiconductor material and the electrode substance is preferably 1 eV or less, more preferably 0.8 eV or less, and still more preferably 0.6 eV or less. Regarding work functions of metals, we can refer to the following literature, as needed:

Literature D: Kagaku Binran (Handbook of Chemistry), Basic Edition, revised 5th ed., 11-608-610, 14.1 b Work Function (Maruzen Publishing Co., Ltd.) (2004).

The size of the conjugated π-electron system in the core portion affects the HOMO and LUMO energy levels. Thus, the size of the conjugated system may be used as a reference in selecting a material. The incorporation of a hetero-element into the core portion is effective as a method for changing the HOMO and LUMO energy levels.

(Examples of Preferred Charge Transporting Molecular Unit A)

Examples of the "charge transporting molecular unit A" that may be suitably used in the present invention are illustrated below, where X represents S, O, or NH.

[Chem. 13]

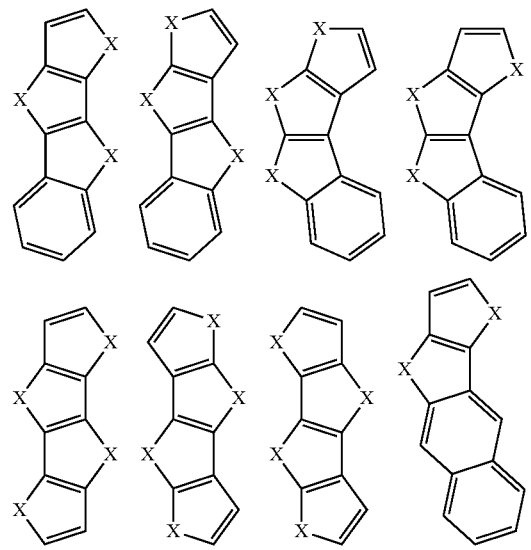

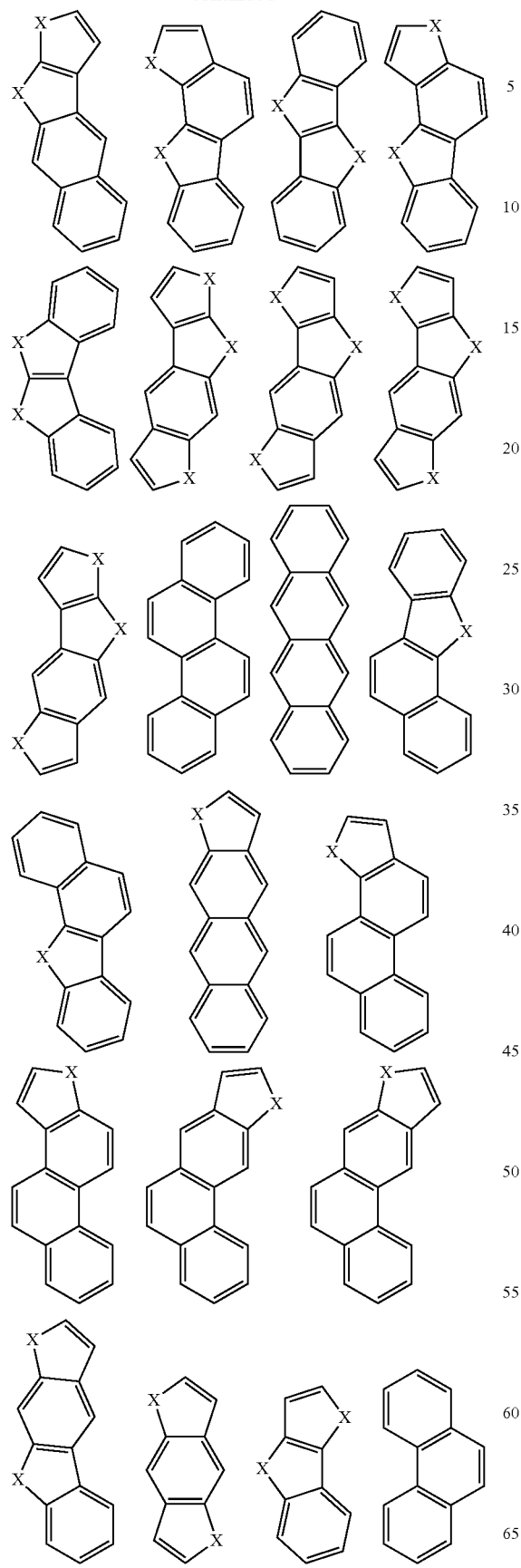
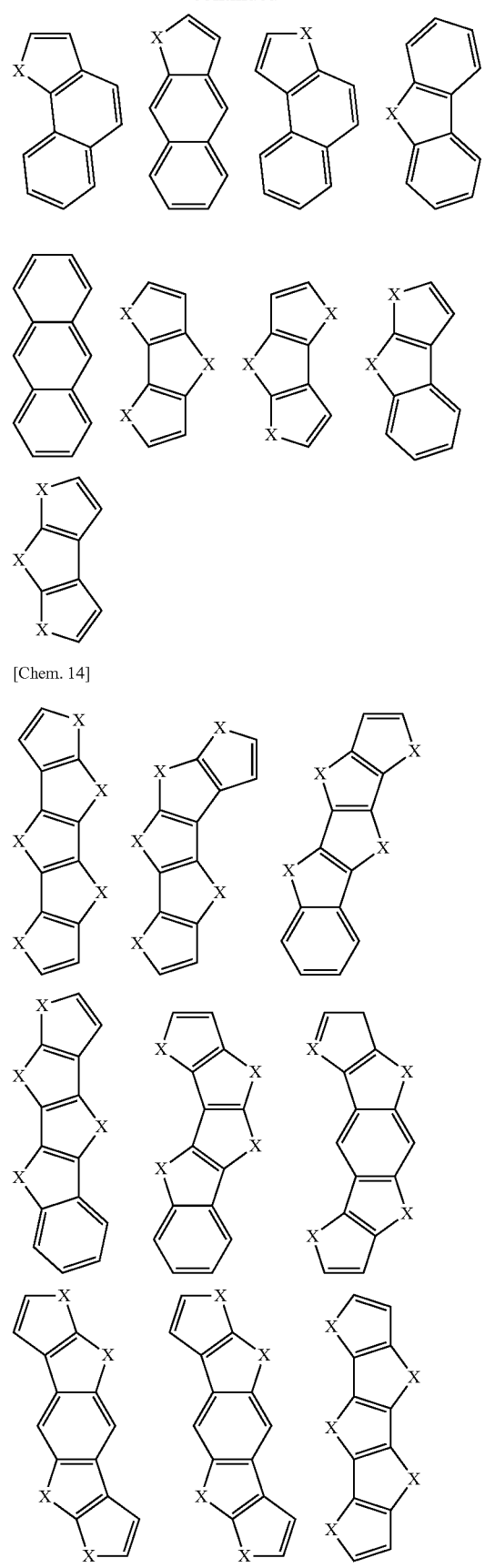
[Chem. 14]

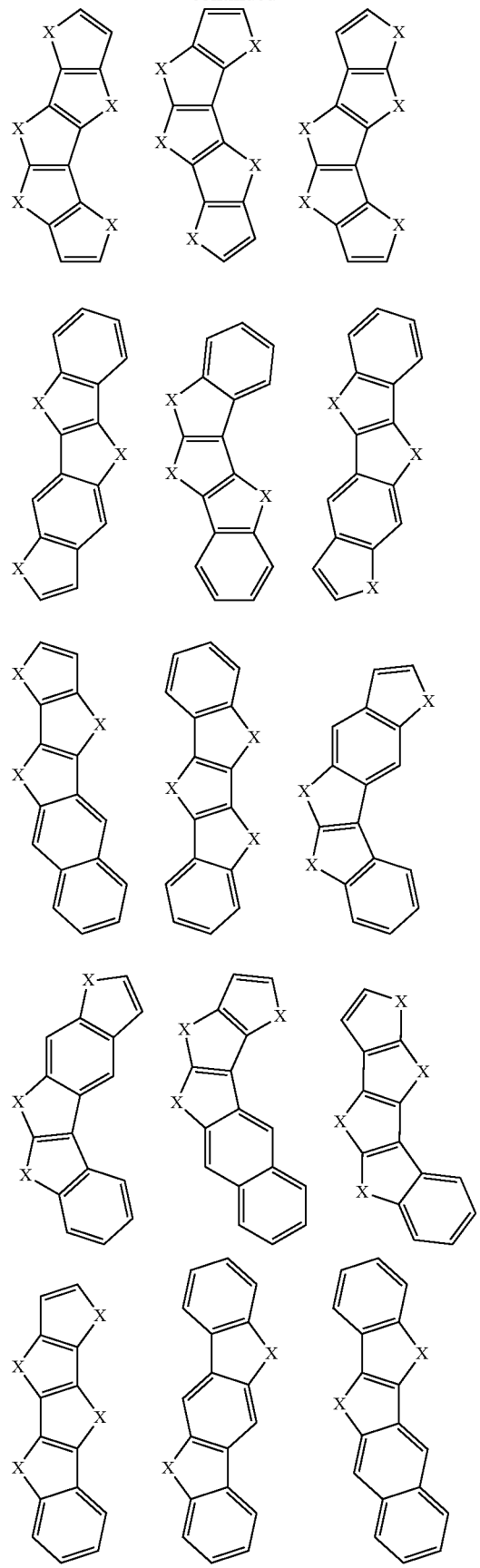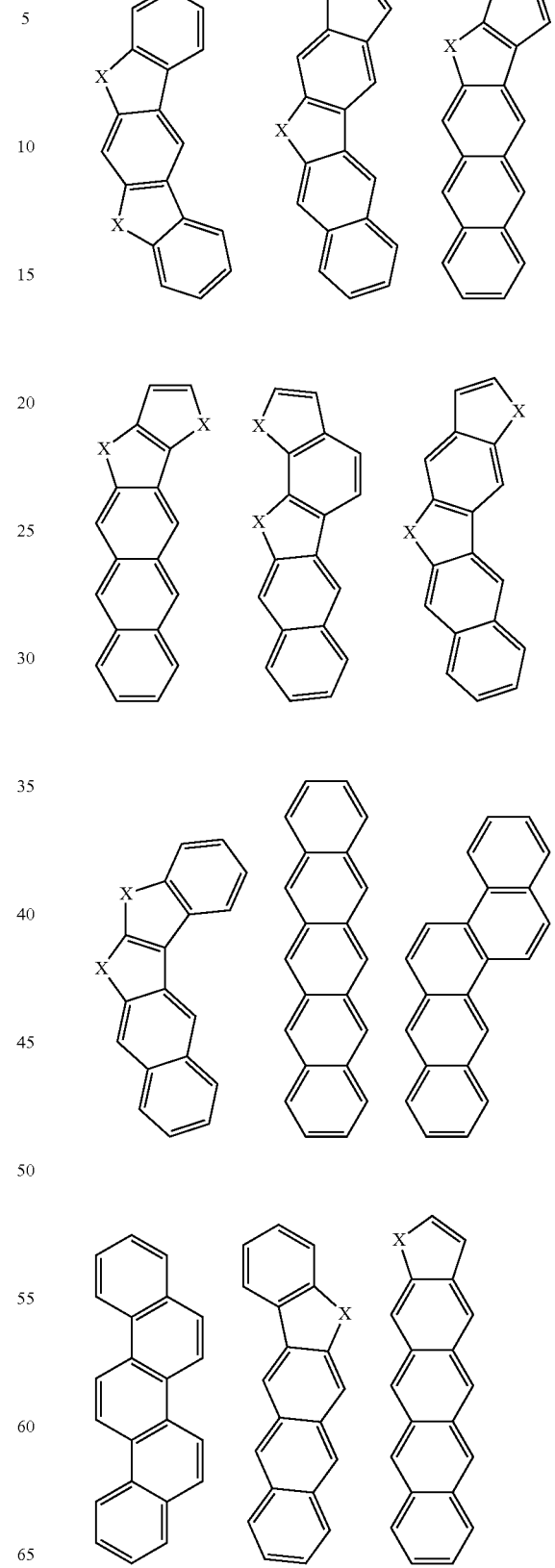

-continued

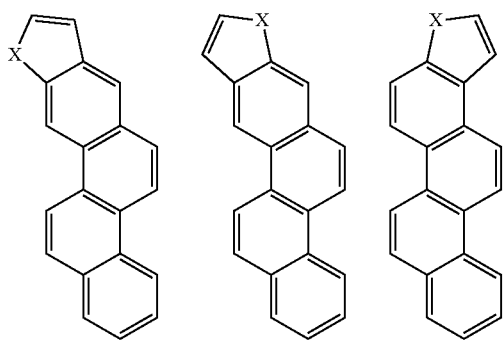

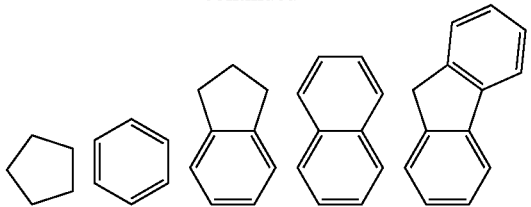

Alternatively, a substituent having an ethinyl structure represented by the following general formula (3) or (4) may be used.

[Chem. 16]

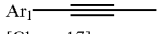
(3)

[Chem. 17]

(4)

$Ar_1$ in the substituent represented by the general formula (3) is not particularly limited as long as it is an optionally substituted aromatic hydrocarbon group or an optionally substituted heteroaromatic group. Examples thereof are listed below.

Examples of the optionally substituted aromatic hydrocarbon group include unsubstituted monocyclic or polycyclic aromatic hydrocarbons each having 6 to 24 carbon atoms, such as a phenyl group, a naphthyl group, an azulenyl group, an acenaphthenyl group, an anthryl group, a phenanthryl group, a naphthacenyl group, a fluorenyl group, a pyrenyl group, a chrysenyl group, a perylenyl group, a biphenyl group, a p-terphenyl group, and a quaterphenyl group; and alkyl-substituted aromatic hydrocarbons in which the foregoing aromatic hydrocarbon groups are substituted with alkyl groups each having 1 to 4 carbon atoms, such as an o-tolyl group, a m-tolyl group, a p-tolyl group, a 2,4-xylyl group, a 2,6-xylyl group, a mesityl group, a duryl group, a 4-ethylphenyl group, a 4-n-propylphenyl group, a 4-isopropylphenyl group, and a 4-n-butylphenyl group.

Examples of the optionally substituted heteroaromatic group include heteroaromatic groups each having a 5-membered or 6-membered ring and polycyclic heteroaromatic groups in which the heteroaromatic groups are condensed with benzene, such as a pyrrolyl group, an indolyl group, a furyl group, a thienyl group, an imidazolyl group, a benzofuryl group, a triazolyl group, a benzotriazolyl group, a benzothienyl group, a pyrazolyl group, an indolizinyl group, a quinolinyl group, an isoquinolinyl group, a carbazolyl group, a dibenzofuranyl group, a dibenzothiophenyl group, an indolinyl group, a thiazolyl group, a pyridyl group, a pyrimidinyl group, a pyrazinyl group, a pyridazinyl group, a thiadiazinyl group, an oxadiazolyl group, a benzoquinolinyl group, a thiadiazolyl group, a pyrrolothiazolyl group, a pyrrolopyridazinyl group, a tetrazolyl group, and an oxazolyl group; and alkyl-substituted heteroaromatic groups in which the heteroaromatic groups are substituted with alkyl groups each having 1 to 4 carbon atoms, such as 5-methylthienyl group.

$Ar_2$ in the substituent represented by the general formula (3) is not particularly limited as long as it represents an optionally substituted aromatic hydrocarbon. Examples thereof are listed below.

(Examples of Preferred Cyclic Structure Unit C)

Examples of the "cyclic structure unit C" that may be suitably used in the present invention are illustrated below. The unit C may be the same as the unit A.

[Chem. 15]

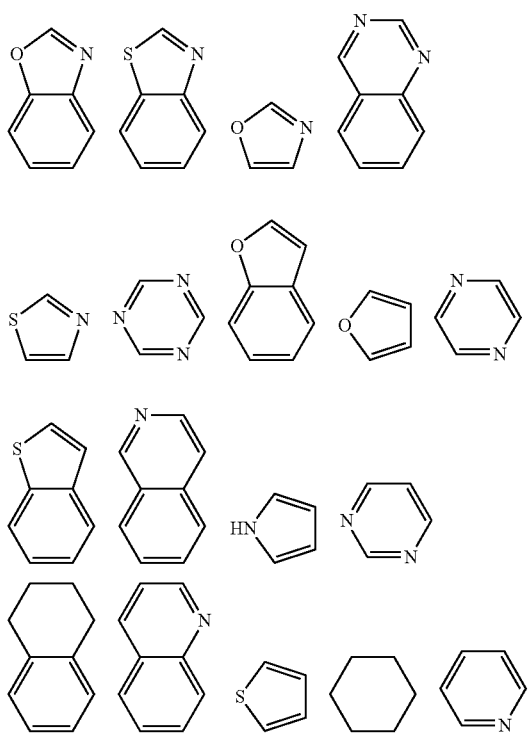

Examples thereof include monocyclic or polycyclic aromatic hydrocarbons each having 6 to 24 carbon atoms, such as a phenylene group, a naphthylene group, an azulenylene group, an acenaphthenylene group, an anthrylene group, a phenanthrylene group, a naphthacenylene group, a fluorenylene group, a pyrenylene group, a chrysenylene group, a perylenylene group, a biphenylene group, a p-terphenylene group, and a quaterphenylene group;

alkyl-substituted aromatic hydrocarbons in which the foregoing aromatic hydrocarbon groups are substituted with alkyl groups each having 1 to 10 carbon atoms, such as an tolylene group, a xylylene group, an ethylphenylene group, a propylphenylene group, a butylphenylene group, methylnaphthylene, and 9,9'-dihexylfluorenylene group; and halogenated aromatic hydrocarbon groups in which the foregoing aromatic hydrocarbon groups are each substituted with a halogen, for example, a fluorine atom, a chlorine atom, or a bromine atom, such as a fluorophenylene group, a chlorophenylene group, and a bromophenylene group.

R' in the general formula (4) represents a hydrogen atom, an alkyl group having 1 to 4 carbon atoms, for example, a methyl group, an ethyl group, a propyl group, or a butyl group, or a halogen atom, for example, a chlorine atom, a bromine atom, or an iodine atom.

(Examples of Preferred Single Bond)

Regarding the "single bond" for linking the units A and C, the single bond being suitably usable in the present invention, among carbon atoms included in the cyclic structures of the unit A and the unit C, carbon atoms located in a molecular long axis direction are selected in such a manner that the molecule has a rod-like shape as a whole. That is, in the present invention, a carbon atom included in the unit A and a carbon atom included in the unit C are directly linked together by the "single bond".

(Examples of Preferred Combination of Unit A and Unit C)

Examples of the "combination of the unit A and the unit C" (the unit A and the unit C are linked together as described above) that may be suitably used are illustrated below.

[Chem. 18]

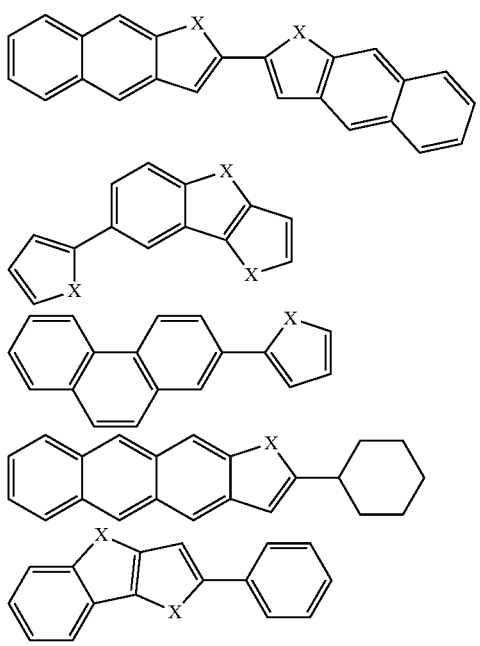

-continued

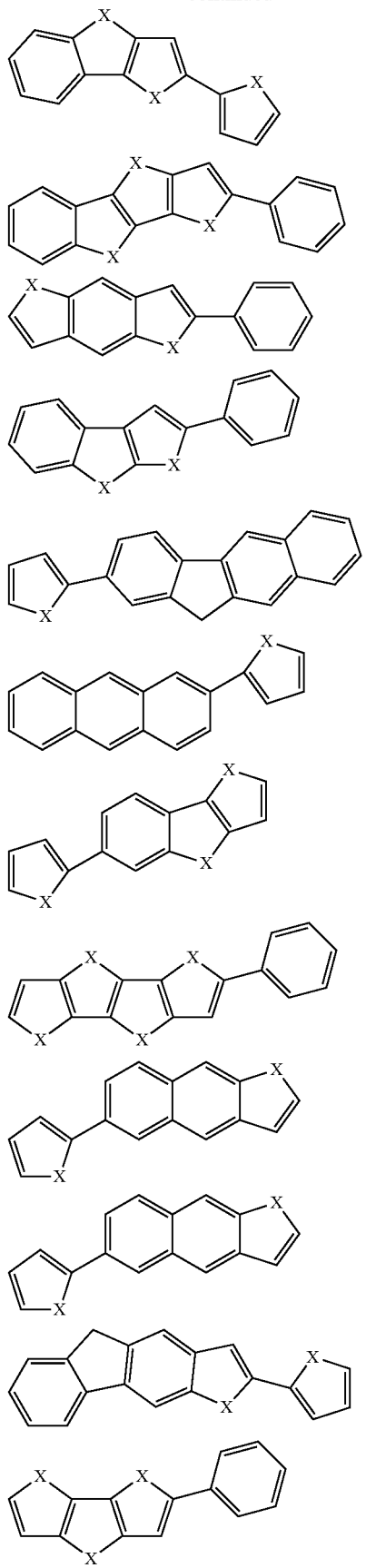

-continued

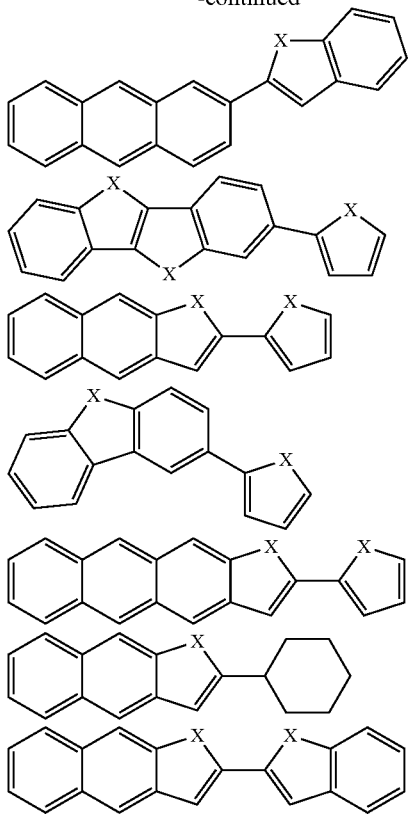

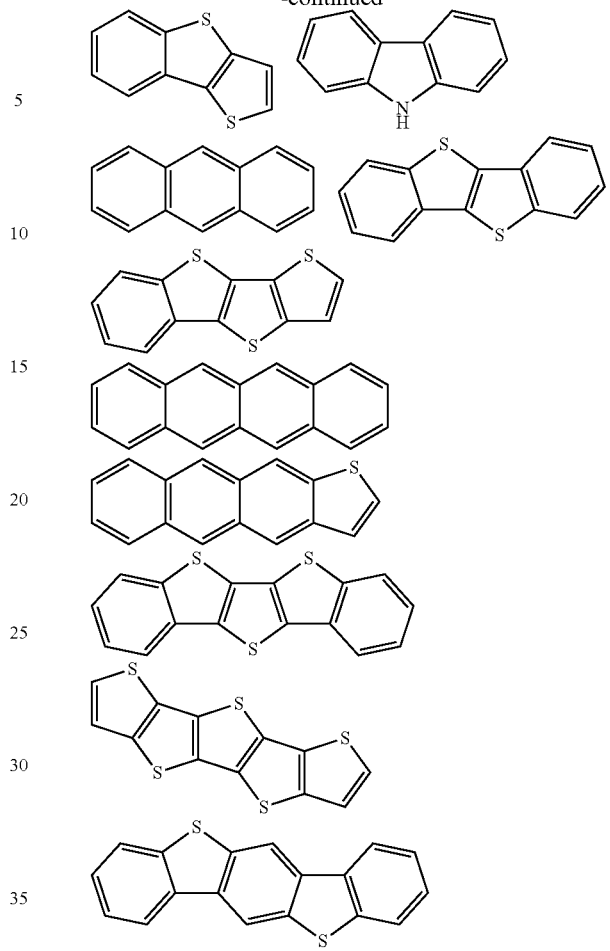

(Preferred Unit B)

The unit B having a linear or branched shape may be used. Preferably, the unit B has a linear shape. The unit B preferably has 2 or more carbon atoms. The unit B more preferably has 3 to 20 carbon atoms. An increase in the number of carbon atoms usually lowers a liquid crystal phase temperature. Thus, in particular, in the case of using a liquid crystal phase as an organic semiconductor, a large number of carbon atoms are advantageous. However, an excessively large number of carbon atoms results in a reduction in solubility in an organic solvent, thereby possibly impairing its suitability for the process. In the case of using the number of carbon atoms, the use of a structure containing oxygen, sulfur, or nitrogen in the unit B is effective in improving the solubility. In this case, a structure in which the unit A or the unit C is not directly linked to an oxygen atom, a sulfur atom, or a nitrogen atom is preferred in view of mobility. A structure in which the unit A or the unit B is linked to oxygen, sulfur, or nitrogen through two or more carbon atoms is preferred in view of chemical stability. Among the foregoing examples, specific examples of the unit A, the unit B, and the unit C particularly suitable for achieving the object of the present invention are illustrated below.

<Unit A>

[Chem. 19]

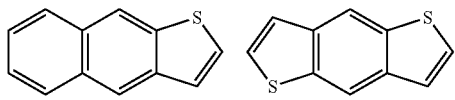

Of these, [1]benzothieno[3,2-b][1]benzothiophene is particularly preferred because of its high charge mobility.

The foregoing compounds for the unit A may have well-known, commonly used substituents that can be attached to the unit A. The substituents are not limited as long as they do not interfere with achieving the object of the present invention. Preferred examples of the substituents are listed below:

alkyl groups, halogen atoms, aliphatic compounds each having a heteroatom, for example, an oxygen atom, a nitrogen atom, or a sulfur atom, alkenyl groups, alkynyl groups, and aromatic compounds serving as substituents, such as thiophene, thienothiophene, benzothiophene, benzene, naphthalene, biphenyl, fluorene, pyridine, imidazole, benzothiazol, and furan.

<Unit C>

Thiophene, thienothiophene, benzothiophene, benzene, naphthalene, biphenyl, fluorene, pyridine, imidazole, benzothiazole, furan, cyclopentene, cyclohexene, tetrahydrofuran, tetrahydropyran, tetrahydrothiophene, pyrrolidine, and piperidine.

The foregoing compounds for the unit C may have well-known, commonly used substituents.

The substituents are not limited as long as they do not interfere with achieving the object of the present invention. Preferred examples of the substituents are listed below:

alkyl groups, halogen atoms, aliphatic compounds each having a heteroatom, for example, an oxygen atom, a nitrogen atom, or a sulfur atom, alkenyl groups, alkynyl groups, and aromatic compounds serving as substituents, such as thiophene, thienothiophene, benzothiophene, benzene, naphthalene, biphenyl, fluorene, pyridine, imidazole, benzothiazol, and furan.

In the unit C described above, for example, benzene, naphthalene, thiophene, thienothiophene, or benzothiophene, is particularly preferred because the mobility is improved by imparting planarity to the crystal structure of the compound.

<Unit B>

Linear alkyl groups each having 2 to 20 carbon atoms:

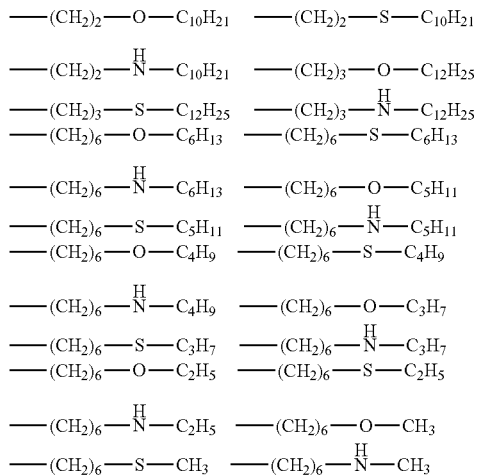

(Anneal Step)

In the case of producing an organic thin film of the present invention, an anneal step may be performed or may not be performed. To improve the mobility, the anneal step is preferably performed. The anneal step may be used to control a crystal phase used as a device material, for example, to improve the crystallinity of a film formed from a solution or the like and to cause a transition from a metastable phase to the most stable phase because of crystalline polymorphism.

The anneal is preferably performed at a temperature lower than a temperature at which a compound containing the charge transporting molecular unit A having a structure of an aromatic fused ring system and the unit B serving as a side chain used in the present invention undergoes a transition from a crystal to a liquid crystal, the former temperature being as close as possible to the temperature at which the transition occurs from the crystal to the liquid crystal. The former temperature close to the latter temperature is, for example, a temperature in the range of a temperature about 10° C. to about 20° C. lower than the transition temperature to the transition temperature, depending on a target compound. In the case of compound 24, an example of the temperature is about 120° C. The time for the annealing is not limited and may be about 5 to about 60 minutes.

(Confirmation of Semiconductor Device Operation)

Measurement of transient photocurrent by a time-of-flight method includes the observation of the generation of a photocharge by light irradiation and charge transport. This measurement system corresponds to the fact that an optical sensor including an organic semiconductor material is produced. Thus, the measurement enables the confirmation of the fact that the organic semiconductor material of the present invention is usable for a semiconductor device operation. Regarding details of the confirmation of the semiconductor device operation by this method, we can refer to, for example, Non-Patent Literature: Appl. Phys. Lett., 74, No. 18, 2584-2586 (1999).

It can be confirmed that by producing an organic transistor and evaluating the properties, the organic semiconductor material of the present invention is usable as an organic transistor. Regarding details of the confirmation of the semiconductor device operation by this method, we can refer to, for example, the following literature: S. F. Nelsona, Y.-Y. Lin, D. J. Gundlach, and T. N. Jackson, Temperature-independent Transistors, Appl. Phys. Lett., 72, No. 15, 1854-1856 (1998).

(Preferred Structure)

Basically, a liquid crystal substance used in the present invention preferably has a structure including a fused ring system having 3 to 5 aromatic rings linked together in a rod-like shape (i.e., substantially linear shape), at least another cyclic structure, and a hydrocarbon chain unit having 3 or more carbon atoms, the fused ring system being linked by a single bond to the at least another cyclic structure in the molecular long axis direction of the fused ring system, and the hydrocarbon chain unit being linked to one of the fused ring system and the at least another cyclic structure in the molecular long axis direction.

As described above, the liquid crystal substance used in the present invention preferably has a structure including the fused ring system having 3 to 5 aromatic rings linked together in a rod-like shape, the at least another cyclic structure, and the hydrocarbon chain unit having 3 or more carbon atoms, the fused ring system being linked by a single bond to the at least another cyclic structure in the molecular long axis direction of the fused ring system, and the hydrocarbon chain unit being linked to one of the fused ring system and the at least another cyclic structure in the molecular long axis direction. Examples thereof are substances illustrated below (see figures).

[Chem. 21]

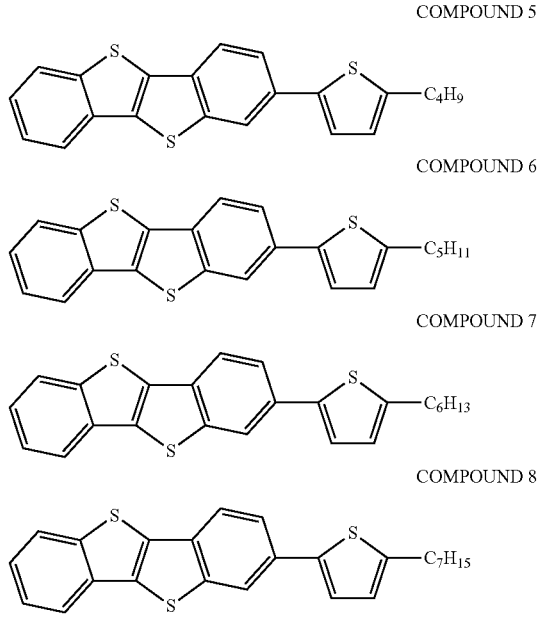

-continued
COMPOUND 9
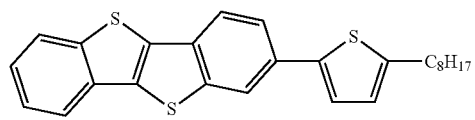
[Chem. 22]
COMPOUND 10
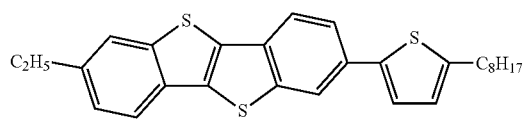
COMPOUND 11
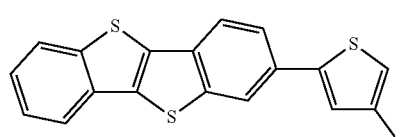
COMPOUND 12
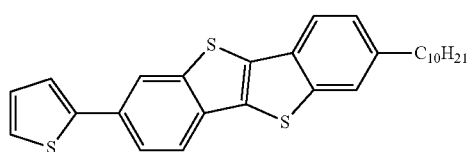
COMPOUND 13
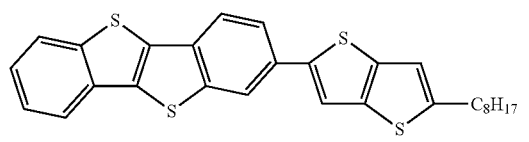
COMPOUND 14
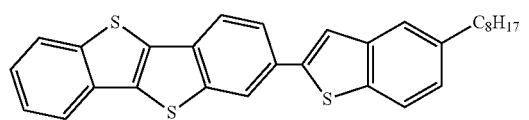
[Chem. 23]
COMPOUND 15
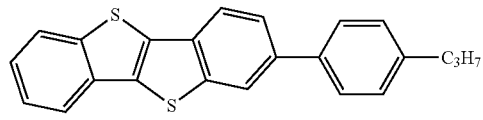
COMPOUND 16
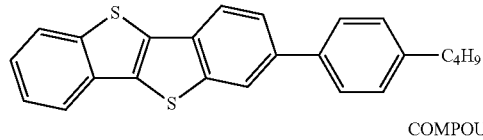
COMPOUND 17
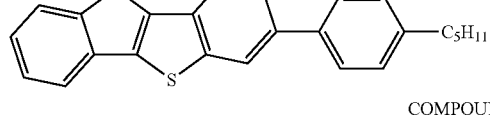
COMPOUND 18
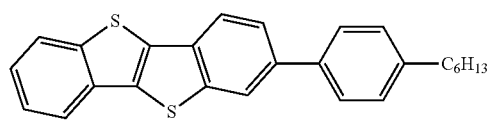
-continued
COMPOUND 19
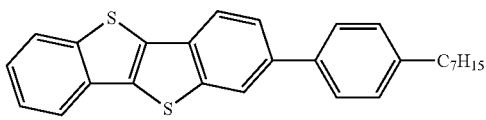
[Chem. 24]
COMPOUND 20
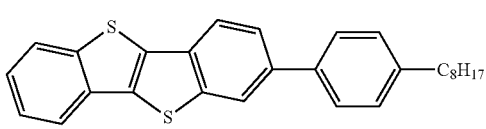
COMPOUND 21
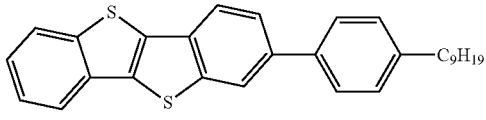
COMPOUND 22
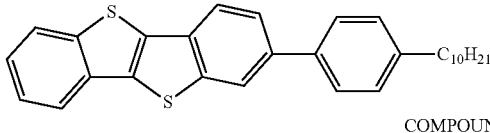
COMPOUND 23
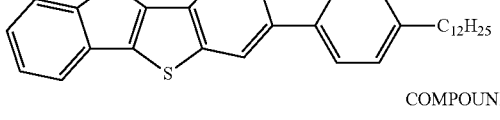
COMPOUND 24
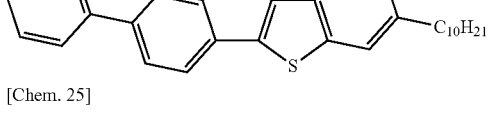
[Chem. 25]
COMPOUND 25
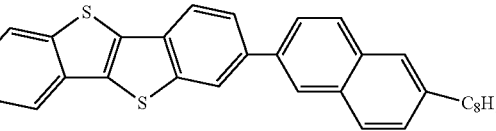
COMPOUND 26
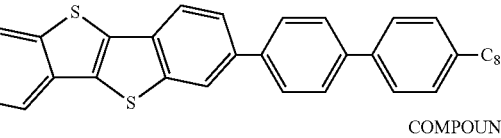
COMPOUND 27
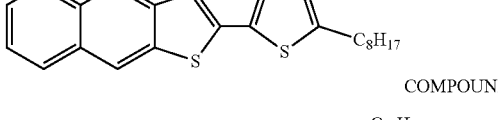
COMPOUND 28
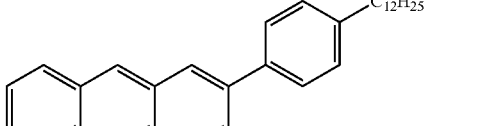

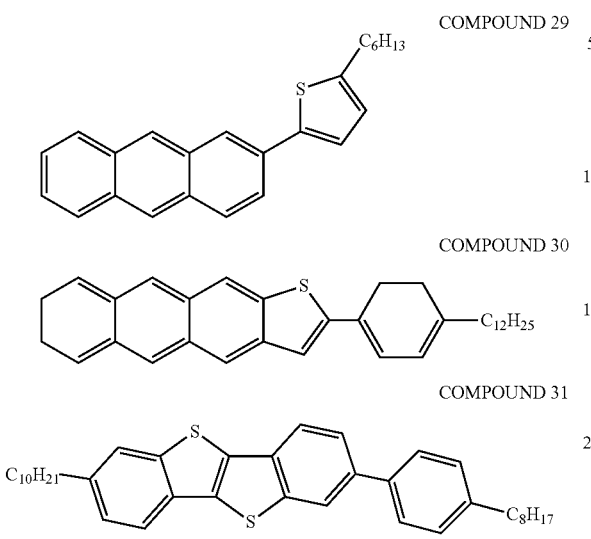

COMPOUND 29

COMPOUND 30

COMPOUND 31

In the group of compounds used in the present invention, the molecular design may be performed by appropriately combining the foregoing units A to C. Specific compounds will be illustrated below. The group of the compounds used in the present invention is not limited thereto.

[Chem. 27]

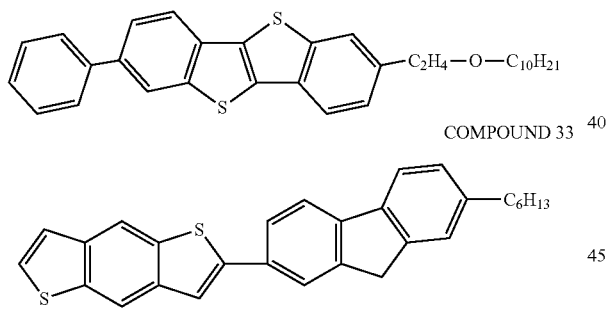

COMPOUND 32

COMPOUND 33

COMPOUND 34

COMPOUND 35

COMPOUND 36

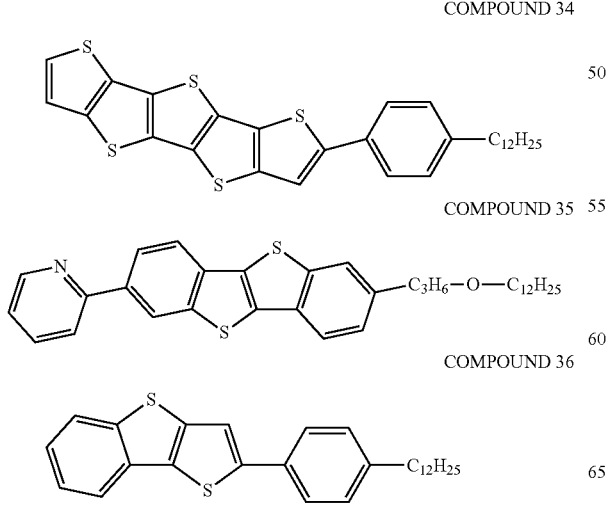

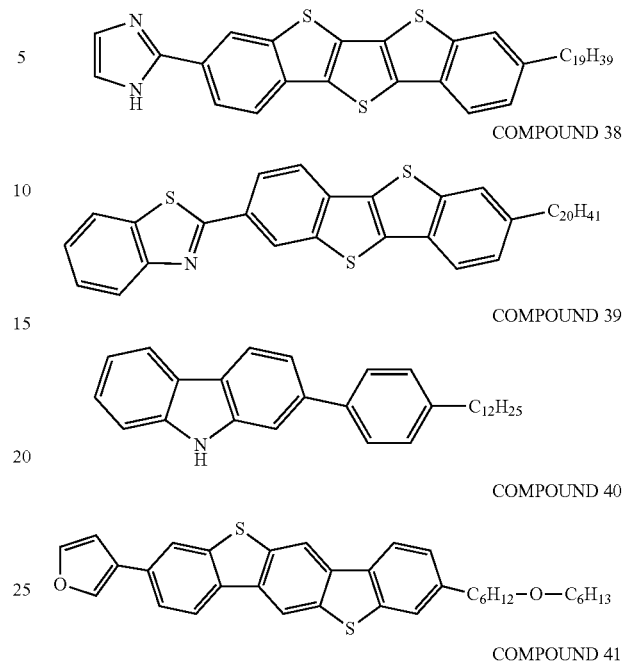

COMPOUND 37

COMPOUND 38

COMPOUND 39

COMPOUND 40

COMPOUND 41

[Chem. 28]

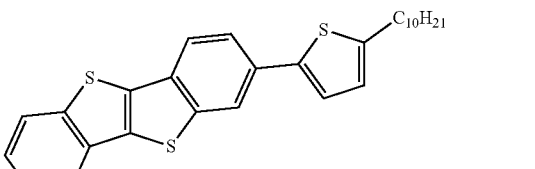

COMPOUND 42

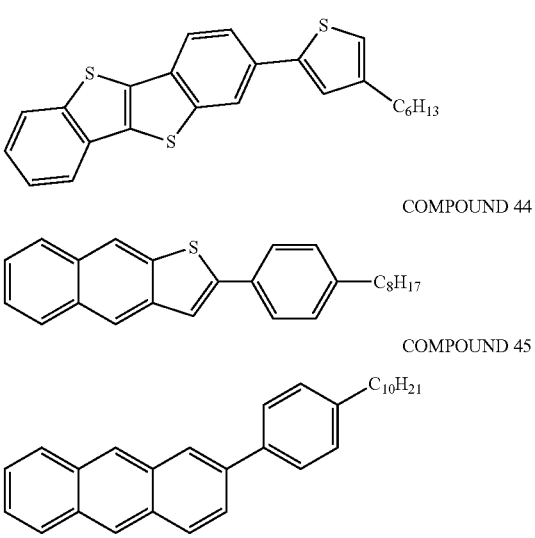

COMPOUND 43

COMPOUND 44

COMPOUND 45

COMPOUND 46
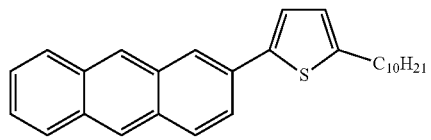
COMPOUND 47
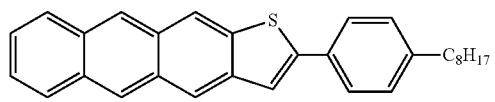
COMPOUND 48
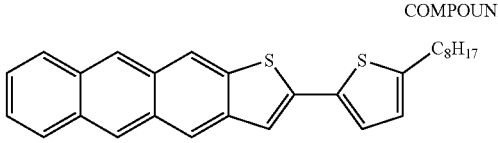
In addition to the foregoing compounds, the following liquid crystal substances are also useful.
[Chem. 29]
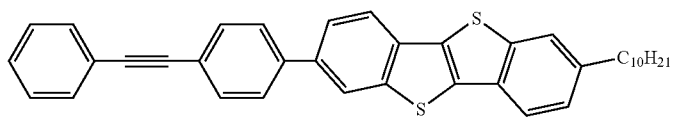
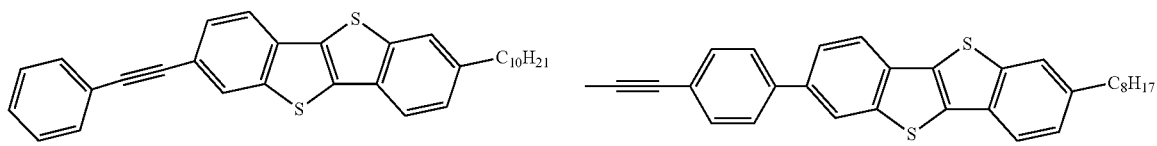
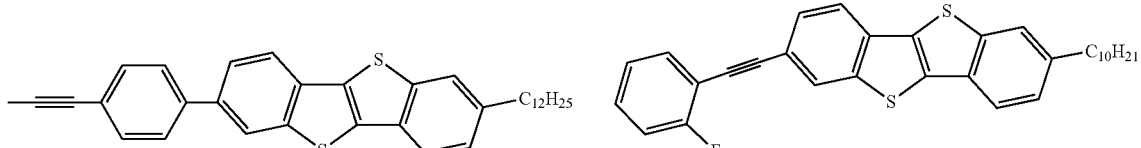
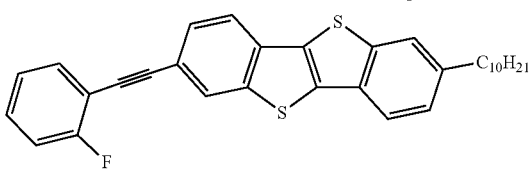
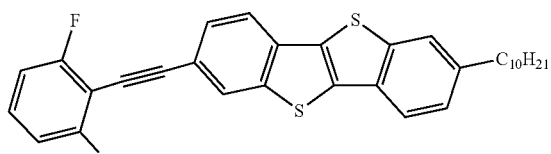
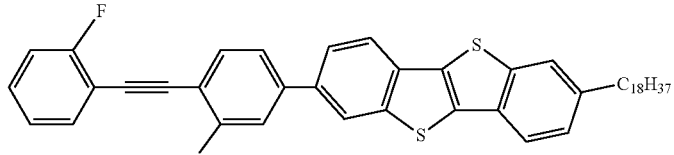
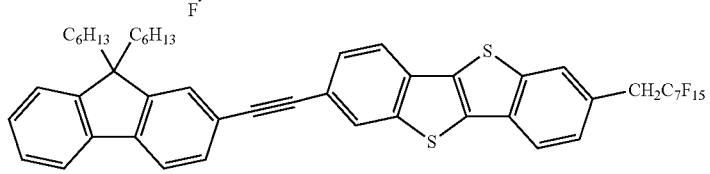
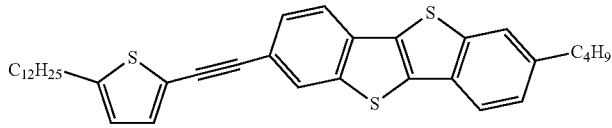
[Chem. 30]
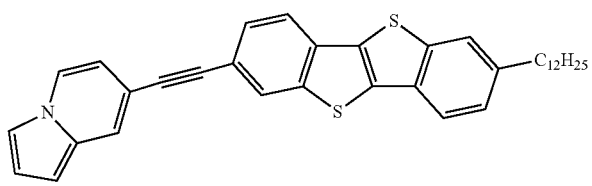

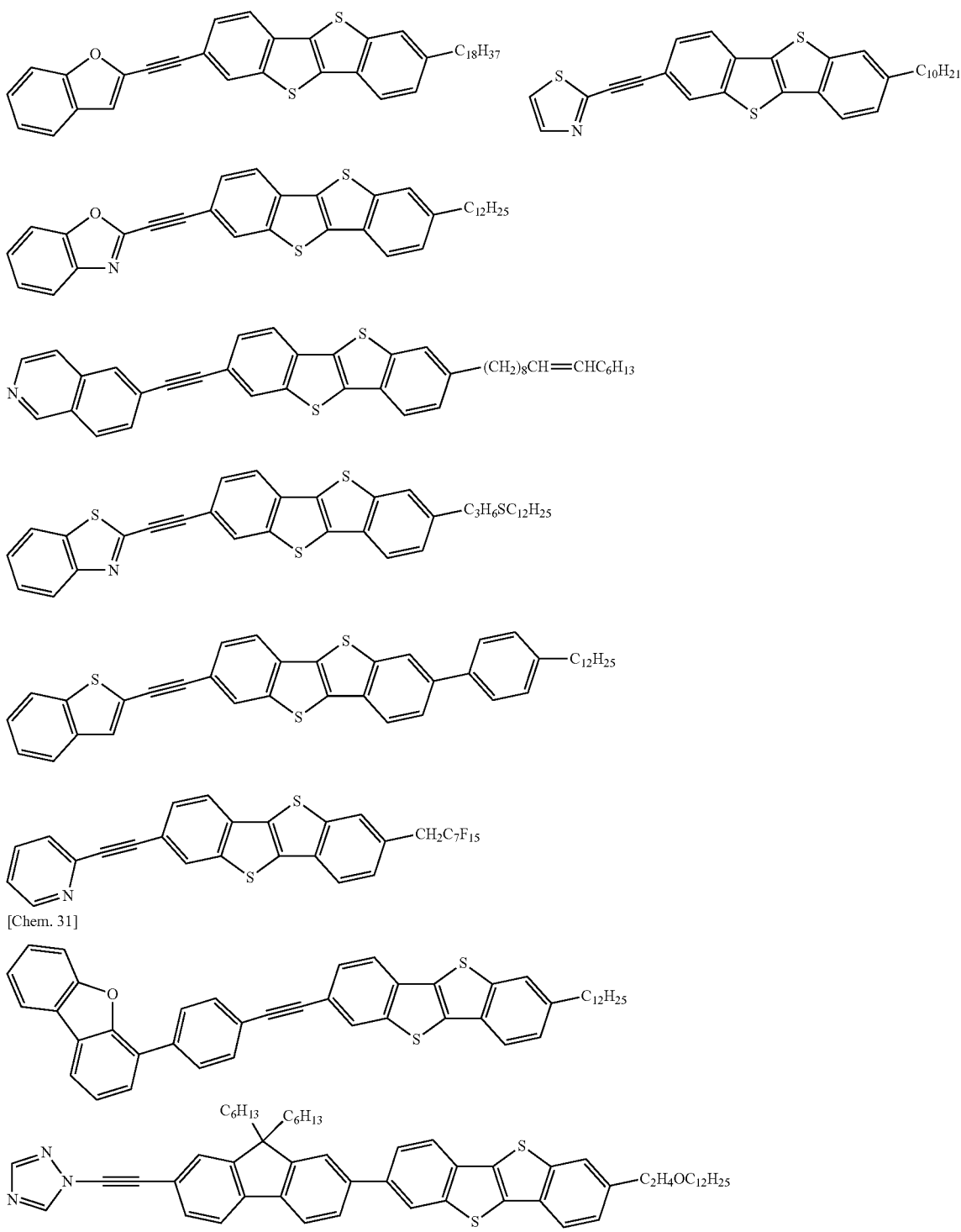

The properties of the foregoing liquid crystal substances are listed in the following tables. Symbols in the tables have meanings described below.
(a) chemical structural formula
(b) phase transition behavior (cooling process)
*I: isotropic phase
N: nematic phase
SmA: smectic A phase
SmC: smectic C phase
SmE: smectic E phase
SmG: smectic G phase
SmX: high-order smectic phase or metastable crystal
K: crystal phase

TABLE 1

| Compound | (a) | (b) |
|---|---|---|
| Compound 5 | [benzothienobenzothiophene-thiophene-C4H9] | I-(201° C.)-SmA-(195° C.)-SmE |
| Compound 6 | [benzothienobenzothiophene-thiophene-C5H11] | I-(202° C.)-SmA-(188° C.)-SmE-(107° C.)-K |
| Compound 7 | [benzothienobenzothiophene-thiophene-C6H13] | I-(200° C.)-SmA-(185° C.)-SmE-(100° C.)-K |
| Compound 8 | [benzothienobenzothiophene-thiophene-C7H15] | I-(201° C.)-SmA-(183° C.)-SmE-(93° C.)-K |
| Compound 9 | [benzothienobenzothiophene-thiophene-C8H17] | I-(198° C.)-SmA-(180° C.)-SmE-(102° C.)-K |

TABLE 2

| Compound | (a) | (b) |
|---|---|---|
| Compound 10 | [H5C2-benzothienobenzothiophene-thiophene-C8H17] | I-(202° C.)-SmA-(188° C.)-SmE-(108° C.)-K |
| Compound 11 | [benzothienobenzothiophene-thiophene(4-C8H17)] | I-(169° C.)-SmX-(115° C.)-K |
| Compound 12 | [thiophene-benzothienobenzothiophene-C10H21] | I-(235° C.)-SmA-(219° C.)-SmE-(71° C.)-K |
| Compound 13 | [benzothienobenzothiophene-thienothiophene-C8H17] | I-(237° C.)-SmX-(184° C.)-K |
| Compound 14 | [benzothienobenzothiophene-thiophene-benzothiophene-C8H17] | I-(202° C.)-SmX-(191° C.)-K |

TABLE 3

| Compound | (a) | (b) |
|---|---|---|
| Compound 15 | [structure with C₃H₇] | I-(243° C.)-N-(223° C.)-SmA-(207° C.)-SmX-(194° C.)-K |
| Compound 16 | [structure with C₄H₉] | I-(231° C.)-N-(223° C.)-SmA-(200° C.)-SmE-(172° C.)-K |
| Compound 17 | [structure with C₅H₁₁] | I-(238° C.)-N-(227° C.)-SmA-(191° C.)-SmE-(165° C.)-K |
| Compound 18 | [structure with C₆H₁₃] | I-(224° C.)-SmA-(186° C.)-SmE-(166° C.)-K |

TABLE 4

| Compound | (a) | (b) |
|---|---|---|
| Compound 19 | [structure with C₇H₁₅] | I-(230° C.)-SmA-(188° C.)-SmE-(148° C.)-K |
| Compound 20 | [structure with C₈H₁₇] | I-(223° C.)-SmA-(182° C.)-SmE-(149° C.)-K |
| Compound 21 | [structure with C₉H₁₉] | I-(221° C.)-SmA-(179° C.)-SmE-(147° C.)-K |
| Compound 22 | [structure with C₁₀H₂₁] | I-(219° C.)-SmA-(178° C.)-SmE-(142° C.)-K |
| Compound 23 | [structure with C₁₂H₂₅] | I-(213° C.)-SmA-(174° C.)-SmE-(136° C.)-K |

TABLE 5

| Compound | (a) | (b) |
|---|---|---|
| Compound 24 | [structure with C₁₀H₂₁] | I-(223° C.)-SmA-(210° C.)-SmE-(90° C.)-K |

TABLE 5-continued

| Compound | (a) | (b) |
|---|---|---|
| Compound 25 | [structure] | I-(194° C.)-SmA-(162° C.)-SmE-(141° C.)-K (temperature rise process) |
| Compound 26 | [structure] | I-(260° C.)-SmX-(175° C.)-K |
| Compound 27 | [structure] | I-(147° C.)-SmX-(134° C.)-K |

TABLE 6

| Compound | (a) | (b) |
|---|---|---|
| Compound 28 | [structure] | I-(205° C.)-SmX-(58° C.)-K |
| Compound 29 | [structure] | I-(155° C.)-SmX-(114° C.)-K |
| Compound 30 | [structure] | I-(305° C.)-SmX-(229° C.)-K |
| Compound 31 | [structure] | I-(249° C.)-SmC-(172° C.)-SmG-(100° C.)-K |

TABLE 7

| Compound | (a) | (b) |
|---|---|---|
| Compound 49 | [structure] 1-P-BTBT-10 | I-(264° C.)-SmA-(210° C.)-SmE |
| Compound 50 | [structure] 1-(3)P-BTBT-10 | I-(176° C.)-SmA-(152° C.)-SmE |

TABLE 7-continued
| Compound | (a) | (b) |
|---|---|---|
| Compound 51 | 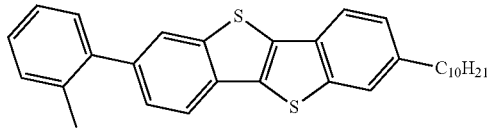<br>1-(2)P-BTBT-10 | I-(91° C.)-SmX |
| Compound 52 | 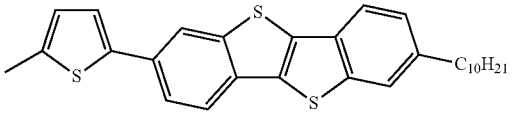<br>1-TP-BTBT-10 | I-(254° C.)-SmA-(211° C.)-SmE-(81° C.)-K |
| Compound 53 | 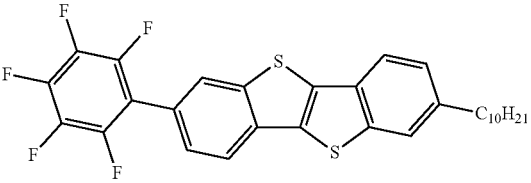<br>FP-BTBT-10 | I-(213° C.)-SmA-(173° C.)-SmE |
| Compound 54 | 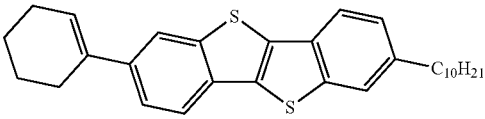<br>Che-BTBT-10 | I-(172° C.)-SmA-(163° C.)-SmE-(57° C.)-K |
| Compound 55 | 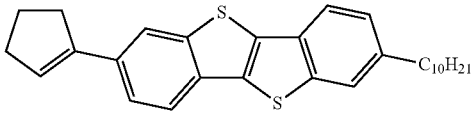<br>CPe-BTBT-10 | I-(211° C.)-SmA-(185° C.)-SmE-(120° C.)-K |
| Compound 56 | 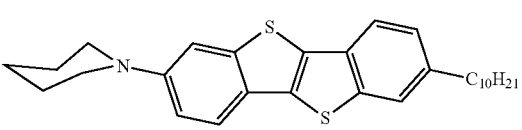<br>Pip-BTBT-10 | I-(126° C.)-SmX-(51° C.)-K |
| Compound 57 | 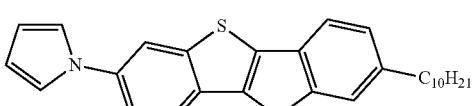<br>Pyr-BTBT-10 | I-(272° C.)-SmA-(243° C.)-SmE-(200° C.)-K |
| Compound 58 | 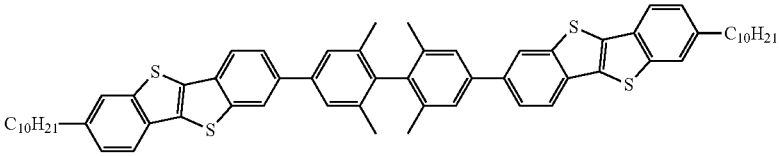<br>RPMa4-(10-BTBT) | I-(311° C.)-N-(265° C.)-SmX-(214° C.)-K |

TABLE 7-continued

| Compound | (a) | (b) |
|---|---|---|
| Compound 59 | BTDT-TP-8 | I-(215° C.)-SmA-(158° C.)-SmE-(98° C.)-K |
| Compound 60 | BTDT-P-8 | I-(272° C.)-SmA-(215° C.)-SmE |
| Compound 61 | NPT-P-8 | I-(274° C.)-SmX |
| Compound 62 | ANT-P-8 | I-(164° C.)-SmX-(128° C.)-K |
| Compound 63 | ANT-P-O12 | I-(174° C.)-SmX$_1$-(138° C.)-SmX$_2$-(112° C.)-K |

EXAMPLES

The present invention will be described in more detail by examples.

Synthesis Example 1

Compound 24 was synthesized from [1]benzothieno[3,2-b][1]benzothiophene (abbreviated as "BTBT") by a method described in WO2012/121393, a scheme according to the method being illustrated in (Chem. 32).

[Chem. 32]

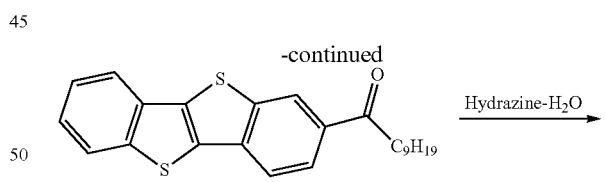

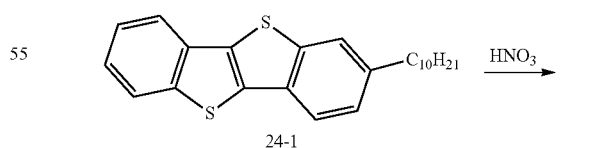

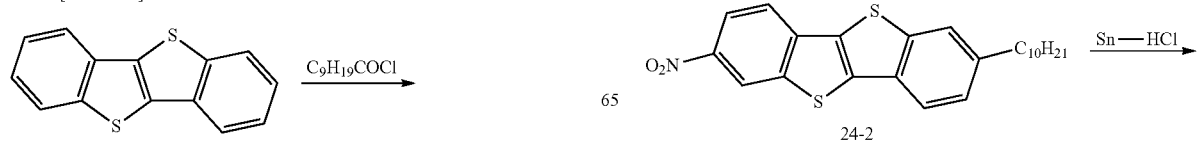

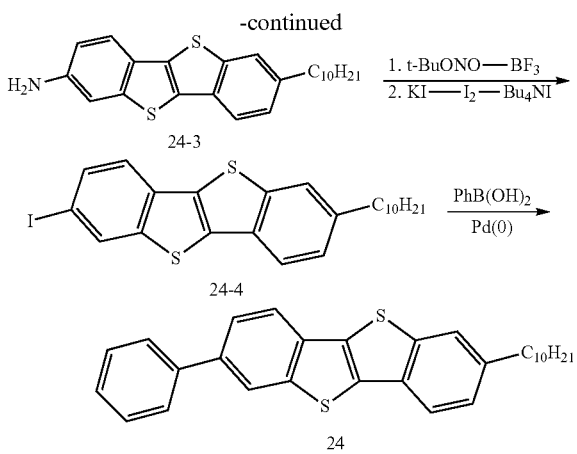

Compound 24-1 (2-decylBTBT) was synthesized by two steps (Friedel-Crafts acylation, Wolff-Kishner reduction) from BTBT according to literatures (Liquid Crystals 2004, 31, 1367-1380 and Collect. Czech. Chem. Commun. 2002, 67, 645-664).

Synthesis of Compound 24-2
(2-decyl-7-nitroBTBT)

A dichloromethane (160 mL) solution of compound 24-1 (2.48 g, 6.52 mmol) was cooled to −50° C. (to precipitate a solid). Then 1.2 M dichloromethane solution of fuming nitric acid (12 mL) was added dropwise thereto over a period of 30 minutes. After the mixture was stirred for another 2 hours at −50° C., a saturated aqueous solution (ca. 13 mL) of sodium bicarbonate was added thereto to terminate the reaction. The resulting liquid was separated, and the lower layer was collected. The lower layer was washed with a 10% saline solution and dried over anhydrous magnesium sulfate. The resulting liquid was concentrated and dried to give a crude solid (2.75 g). The solid was recrystallized from 2-butanone (ca. 40 mL) to give 1.86 g of yellow crystals of compound 24-2 (yield: 67%).

H-nmr (270 MHz, CDCl$_3$): δ 8.83 (d, 1H, J 2.2 Hz, H-6), 8.31 (dd, 1H, J 8.8 and 2.2 Hz, H-8), 7.92 (d, 1H, J 8.8 Hz, H-9), 7.84 (d, 1H, J 8.2 Hz, H-4), 7.75 (d, 1H, J 1.4 Hz, H-1), 7.33 (dd, 1H, J 8.2 and 1.4 Hz, H-3), 2.78 (t, 2H, J ca. 7.5 Hz, ArCH$_2$), 1.71 (quint. 2H, J ca. 7.5 Hz, ArCH$_2$CH$_2$), ca. 1.2 to ca. 1.4 (m, 14H, CH$_2$×7), 0.88 (t, 3H, J ca. 7 Hz, CH$_2$)

Synthesis of Compound 24-3
(7-decylBTBT-2-amine)

Compound 24-2 (1.28 g, 30 mmol) and tin (0.92 g) were suspended in acetic acid (15 mL). Concentrated hydrochloric acid (2.7 mL) was slowly added dropwise to the resulting suspension heated at about 70° C. under stirring. The reaction was performed at 100° C. for 1 hour. The reaction mixture was then cooled to 10° C. or lower. A solid was collected by filtration. The solid was put into chloroform (ca. 100 mL), washed with concentrated aqueous ammonia and then a saturated saline solution. The resulting mixture was dried over anhydrous magnesium sulfate, concentrated, and dried to give a crude solid (1.1 g). The solid was separated and purified on a silica gel column (chloroform-cyclohexane: 1:1, 1% triethylamine was added) and recrystallized from petroleum benzin to give 0.86 g of light gray compound 24-3 (yield: 72%).

H-nmr (270 MHz, CDCl$_3$): δ 7.68 (d, 1H, J 8.2 Hz, H-9), 7.67 (broadened s, 1H, H-6), 7.62 (d, 1H, J 8.4 Hz, H-4), 7.23 (dd, 1H, J 1.5 and 8.2 Hz, H-8), 7.16 (d, 1H, J ca. 2 Hz, H-1), 6.81 (dd, 1H, J ca. 2 and 8.4 Hz, H-3), 3.84 (slightly broadened s, ca. 2H, NH$_2$), 2.73 (t, 2H, J ca. 7.5 Hz, ArCH$_2$), 1.68 (quint. 2H, J ca. 7.5 Hz, ArCH$_2$CH$_2$), ca. 1.2 to ca. 1.4 (m, 14H, CH$_2$×7), 0.87 (t, 3H, J ca. 7 Hz, CH$_3$).

Synthesis of Compound 24-4
(2-decyl-7-iodoBTBT)

BF$_3$-Et$_2$O (216 mg) and tert-butyl nitrite (126 mg) were added dropwise to a dichloromethane (15 mL) solution of compound 24-3 (396 mg, 1 mmol) with cooling at −15° C. The reaction temperature was increased to 5° C. over a period of about 1 hour. A dichloromethane-THF (1:2) mixed solution (3 mL) of iodine (400 mg), potassium iodide (330 mg), and tetrabutylammonium iodide (25 mg) was then added thereto. A reaction is performed for 8 hours under reflux by heating. The reaction mixture was diluted with chloroform and washed with 10% sodium thiosulfate, 5 M sodium hydroxide, and 10% saline solution, in that order. The reaction mixture was dried over anhydrous sodium sulfate, concentrated, and dried. The resulting deep brown crude solid (500 mg) was purified on a silica gel column (chloroform-cyclohexane, 1:1) and crystallized from chloroform-methanol. The resulting product was recrystallized from ligroin to give 228 mg of compound 24-4 (yield: 45%).

H-nmr (500 MHz, CDCl$_3$): δ 8.23 (d, 1H, J 1.4 Hz, H-6), 7.77 (d, 1H, J 8.2 Hz, H-4), 7.72 (dd, 1H, J 1.4 and 8.2 Hz, H-8), 7.71 (d, 1H, J 1.4 Hz, H-1), 7.59 (d, 1H, J 8.2 Hz, H-9), 7.29 (dd, 1H, J 1.4 and 8.2 Hz, H-3), 2.76 (t, 2H, J 7.8 Hz, ArCH$_2$), 1.69 (quint., 2H, J ca. 7.5 Hz, ArCH$_2$CH$_2$), ca. 1.2 to ca. 1.4 (m, 14H, CH$_2$×7), 0.88 (t, 3H, J ca. 7 Hz, CH$_2$).

Synthesis of Compound 24
(2-decyl-7-phenylBTBT)

To a dioxane (8 mL) solution of compound 24-4 (228 mg, 0.45 mmol), 2 M tripotassium phosphate (0.45 mL) and phenylboronic acid (110 mg, 0.9 mmol, Tokyo Chemical Industry Co., Ltd.) were added. Argon gas was bubbled into the resulting mixture for 20 minutes. Tetrakis(triphenylphosphine)palladium (30 mg, 0.025 mmol, Tokyo Chemical Industry Co., Ltd.) and tricyclohexylphosphine (13 mg, 0.045 mmol, Wako Pure Chemical Industries, Ltd.) were added thereto. The resulting mixture was heated at 95° C. for 22 hours under stirring. The reaction solution was diluted with chloroform and washed with a 10% saline solution. The lower layer was concentrated and dried to give a crude solid (293 mg). The solid was recrystallized from toluene to give 130 mg of compound 24 (yield: 63%).

H-nmr (500 MHz, CDCl$_2$): δ 8.12 (d, 1H, J 1.8 Hz, H-6), 7.92 (d, 1H, J 8.2 Hz, H-9), 7.79 (d, 1H, J 7.8 Hz, H-4), 7.73 (br. s, 1H, H-1), 7.69 (d×2, 3H, H-8, 2', 6' (' denotes Ph)), 7.49 (t, 2H, J ca. 8 Hz, H-3', 5'), 7.38 (tt, 1H, J>1 and ca. 8 Hz, H-4'), 7.29 (dd, 1H, J>1 and 7.8 Hz, H-3), 2.77 (t, 2H, J ca. 7 Hz, ArCH$_2$), 1.70 (quint. 2H, J ca. 7 Hz, ArCH$_2$CH$_2$), ca. 1.2 to ca. 1.4 (m, 14H, CH$_2$×7), 0.88 (t, 3H, J ca. 7 Hz, CH$_3$)

Synthesis Example 2

Compound 64 (2-dodecyl-7-phenylBTBT) was synthesized as in Synthesis example 1, except that C$_{11}$H$_{23}$COCl was used in place of C$_9$H$_{19}$COCl.

Example 1

A bilayer structure and transistor characteristics when the compound (compound 24) obtained in Synthesis example 1 was used were confirmed by methods described below.

(Production of Thin Film)

A silicon wafer provided with a thermal oxide film (heavily doped p-type silicon (P+—Si), thickness of the thermal oxide film ($SiO_2$): 300 nm) was cut into a size of 20×25 mm. The cut silicon wafer (hereinafter, referred to as a "substrate") was subjected to ultrasonic cleaning with a neutral detergent, ultrapure water, isopropyl alcohol (IPA), acetone, and IPA, in that order.

Next, the compound of Synthesis example 1 was dissolved in xylene to prepare a solution. The concentration of the solution was 1% to 0.5% by weight. The solution and a glass pipette used to apply the solution onto the substrate were heated on a hot stage to a predetermined temperature in advance. The substrate was placed on a spin coater installed in an oven. The temperature in the oven was increased to about 100° C. Then the solution was applied onto the substrate. The substrate was rotated (at about 3000 rpm for 30 seconds). After the rotation was stopped, the substrate was quickly taken out and cooled to room temperature. Furthermore, the resulting organic thin film was subjected to thermal anneal at 120° C. for 5 minutes.

(XRD Measurement)

Low-angle, out-of-plane XRD measurement was performed with RIGAKU RAD-2B (X-ray source: CuKα radiation, wavelength: 1.54 Å, divergence slit: ⅙°, scattering slit: 0.15 mm, receiving slit: ⅙°). A θ-2θ scan was performed from 1° to 5°.

Figure 5:
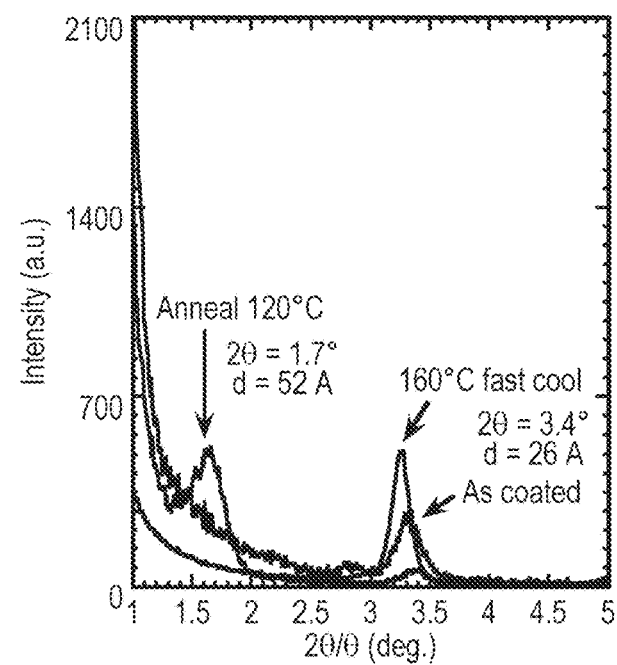
FIG. 5 is an XDR pattern measured in Example 1.

FIG. 5 illustrates the data of compound 24.

(Production of Transistor)

A gold pattern was formed by a vacuum evaporation method ($2 \times 10^{-6}$ Torr) with a metal mask on the substrate on which the organic semiconductor layer had been formed by application, thereby forming source-drain electrodes (channel length:channel width=100 μm:500 μm).

The resulting organic transistor was evaluated as described below. In an ambient air atmosphere, a current that flows between a source electrode and a drain electrode was measured (transfer characteristics) with a source-measurement unit having two power supplies while performing sweep application (Vsg: +10 to −100 V) of a voltage to a gate electrode (P+—Si) (voltage Vsd between the source electrode and the drain electrode: −100 V). The mobility was calculated from the slope of √Id–Vg in the transfer characteristics by a well-known method using a formula of saturation characteristics (FIG. 6).

Figure 6:
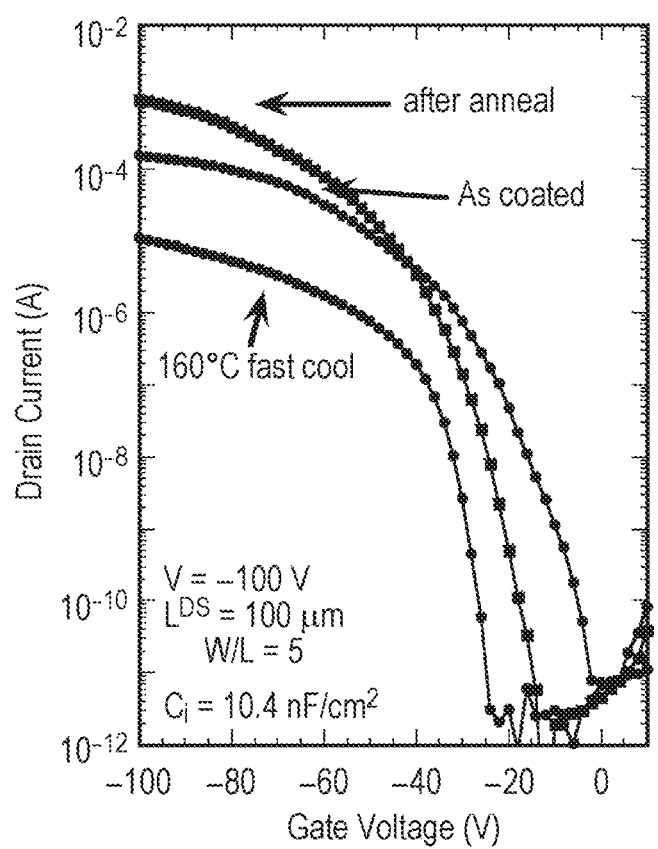
FIG. 6 is a graph used to determine mobility in Example 1.

In FIG. 6, a sample obtained by forming the thin film without performing subsequent processing is designated by "As coated". A sample obtained by subjecting the organic thin film to thermal anneal at 120° C. for 5 minutes is designated by "after anneal". A sample obtained by heating the organic thin film to 160° C., which is a liquid crystal phase temperature, and then fast cooling the film is designated by "160° C. fast cool". In the sample obtained by heating the organic thin film to 160° C. and then fast cooling the film, it was found that the mobility was decreased.

The measurement of the mobility was performed for five transistors. The average and the standard deviation were described. Table 8 lists the results.

(Confirmation of Bilayer Structure)

A 200-nm-thick thermal oxide film ($SiO_2$) was formed on a silicon substrate with a resistivity of 0.02 Ω·cm. A xylene solution of 0.5% by weight of the compound of Synthesis example 1 was applied onto the thermal oxide film of the silicon substrate having a diameter of 1 inch with a bar coater (No. 26) and dried to produce a measurement sample of an organic thin film having a thickness of about 80 nm.

Next, the measurement sample was measured with a first hatch of beamline BL03XU owned by Frontier Soft Matter Beamline Consortium in high-intensity synchrotron radiation experimental facility SPring-8 under conditions as follows: measurement mode: Grazing Incident Small Angle Scattering/Wide Angle Scattering, GISAXS/WAXS, camera length: 140 mm and 2300 mm, wavelength: 0.1 nm, X-ray incident angle: 0.08° or 0.16°, exposure time: 1 to 5 seconds, measured temperature: 25° C., scattering angle range: 2θ=0.1° to 20°, and so forth.

The resulting two-dimensional X-ray scattering image was analyzed by a method described below to determine the structure of the thin film. The center position of a reflected X-ray beam in the two-dimensional scattering image was determined from the X-ray incident angle at the time of measurement. Scattering-diffraction intensity I on a straight line in the horizontal direction when viewed from the center of the reflected beam was measured. A one-dimensionalized scattering profile H as scattering intensity I with respect to a scattering angle 2θ from the center of the reflected beam was obtained. Similarly, scattering-diffraction intensity I on a straight line in the upward vertical direction when viewed from the center of the reflected beam was measured. A one-dimensionalized scattering profile V as scattering intensity I with respect to a scattering angle 2θ from the center of the reflected beam was obtained. We focused on the highest-intensity peak in each of the scattering profiles H and V. A periodic length d [nm] was calculated from the expression $2d \sin(2\theta/2)=\lambda$ using the scattering angle 2θ at the position of the peak, where λ [nm] denotes an X-ray wavelength of 0.1 nm.

From the scattering profile H, a periodic length of about 4 Å and so forth originating from a periodic structure (interplanar spacing) in a direction substantially orthogonal to a molecular chain in the alignment structure of target molecules were calculated. From the scattering profile V, a periodic length of about 30 Å originating from the molecular length of a compound was calculated. From the measurement principle of GISAXS/WAXS, information on the in-plane periodic structure of the thin film is obtained from the scattering profile H. Information on a periodic structure in a stacked state of the thin film is obtained from the scattering profile V. From a diffraction profile characteristic of a high-order smectic phase and the structural features of the liquid crystal phase, it was found that the organic thin film had a bilayer structure in which compound molecules were arranged perpendicularly to a substrate and stacked every about 30 Å corresponding to a molecular length. Table 8 lists the results.

FIG. 1 illustrates the resulting two-dimensional X-ray scattering image. The scattering image demonstrates that peaks originating from a certain stacking period are observed from the center of the beam in the Y-axis direction, whereas no peaks are observed in the X-axis direction. This also indicates the bilayer structure.

Example 2

Evaluations were made in the same way as in Example 1, except that a liquid crystal substance of compound 9 prepared according to WO2012/121393 was used in place of the compound of Synthesis example 1 and that the conditions of the anneal after the formation of the organic thin film were changed to conditions where the anneal was performed in toluene vapor for 1 minute. Table 8 lists the results.

Example 3

Evaluations were made in the same way as in Example 1, except that a liquid crystal substance of compound 64 was used in place of the compound of Synthesis example 1 and that the conditions of the anneal after the formation of the organic thin film were changed to conditions where the anneal was performed at 130° C. for 30 minutes. Table 8 lists the results.

Example 4

Evaluations were made in the same way as in Example 1, except that a liquid crystal substance of compound 23 was used in place of the compound of Synthesis example 1, ethylbenzene was used in place of toluene, and the conditions of the anneal after the formation of the organic thin film were changed to conditions where the anneal was performed at 110° C. for 30 minutes. Table 8 lists the results.

Comparative Example 1

Evaluations were made in the same way as in Example 1, except that the thermal anneal at 120° C. was not performed. Table 8 lists the results.

Figure 2:
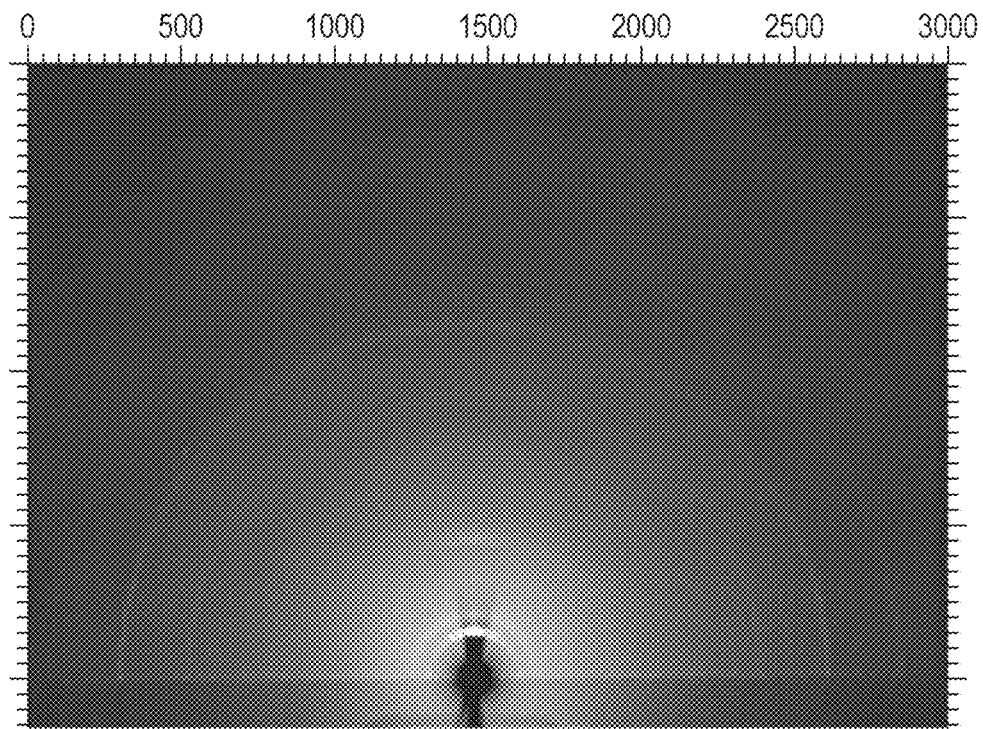
FIG. 2 is the measurement result of an organic thin film at Spring 8, the organic thin film having no bilayer structure illustrated in Comparative Example 1.
Figure 3:
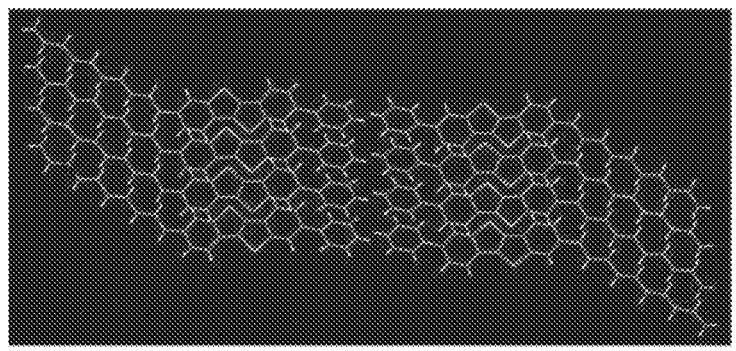
FIG. 3 illustrates a single-crystal structure analysis of an organic thin film according to the present invention, the organic thin film having a bilayer structure illustrated in Example 1.
Figure 4:
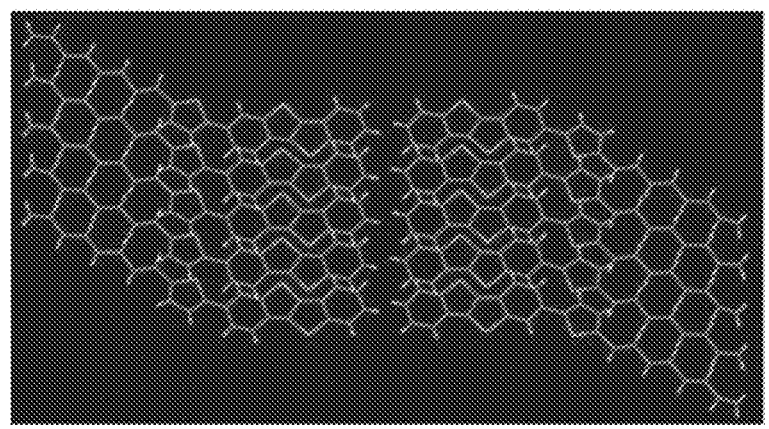
FIG. 4 illustrates a single-crystal structure analysis of an organic thin film according to the present invention, the organic thin film having a bilayer structure illustrated in Example 1.

FIG. 2 illustrates the resulting two-dimensional X-ray scattering image. The scattering image demonstrates that concentric circles are observed from the center of the beam in the X-axis direction and the Y-axis direction. This indicates that the liquid crystal substance is randomly present without being oriented.

Comparative Example 2

Evaluations were made in the same way as in Example 2, except that the anneal (in toluene vapor for 1 minute) was not performed. Table 8 lists the results.

Comparative Example 3

Evaluations were made in the same way as in Example 3, except that the thermal anneal (at 130° C.) was not performed. Table 8 lists the results.

Comparative Example 4

Evaluations were made in the same way as in Example 4, except that the thermal anneal (at 110° C.) was not performed. Table 8 lists the results.

TABLE 8

|  | Liquid crystal substance | Bilayer structure observed at Spring 8 | Mobility of organic transistor (cm$^2$/Vs) | Standard deviation of mobility |
| --- | --- | --- | --- | --- |
| Example 1 | compound 24 | present | 12.2 | 1.6 |
| Example 2 | compound 9 | present | 3.6 | 0.51 |
| Example 3 | compound 64 | present | 5.8 | 1.2 |
| Example 4 | compound 23 | present | 1.2 | 0.6 |
| Comparative example 1 | compound 24 | absent | 0.7 | 0.58 |
| Comparative example 2 | compound 9 | absent | 0.004 | 0.008 |
| Comparative example 3 | compound 64 | absent | 1.8 | 0.24 |
| Comparative example 4 | compound 23 | present | 0.6 | 0.14 |

Comparisons of examples with comparative examples clearly indicates that the organic thin film in which the bilayer structure is observed or which has been subjected to the anneal step exhibits high mobility when the same liquid crystal substance is used.

(Single-Crystal Structure Analysis of Compound 24 and Study on Molecular Orientation of Polycrystalline Thin Film)

A single crystal of compound 24 was produced by recrystallization from a xylene solution. The single-crystal structure analysis was performed with R-AXIS RAPID II/R manufactured by Rigaku. To obtain information of molecular orientation in a polycrystalline thin film, composition analysis in the thickness direction was performed by TOF-SIMS. Furthermore, the transfer integral from the configuration of molecules in the single crystal was also studied.

The results of the X-ray structure analysis indicated a bilayer structure in which the core portion of compound 24 (portion consisting of the phenyl ring and benzothienobenzothiophene) had a herringbone structure and the core portions faced each other between layers.

Figure 7:
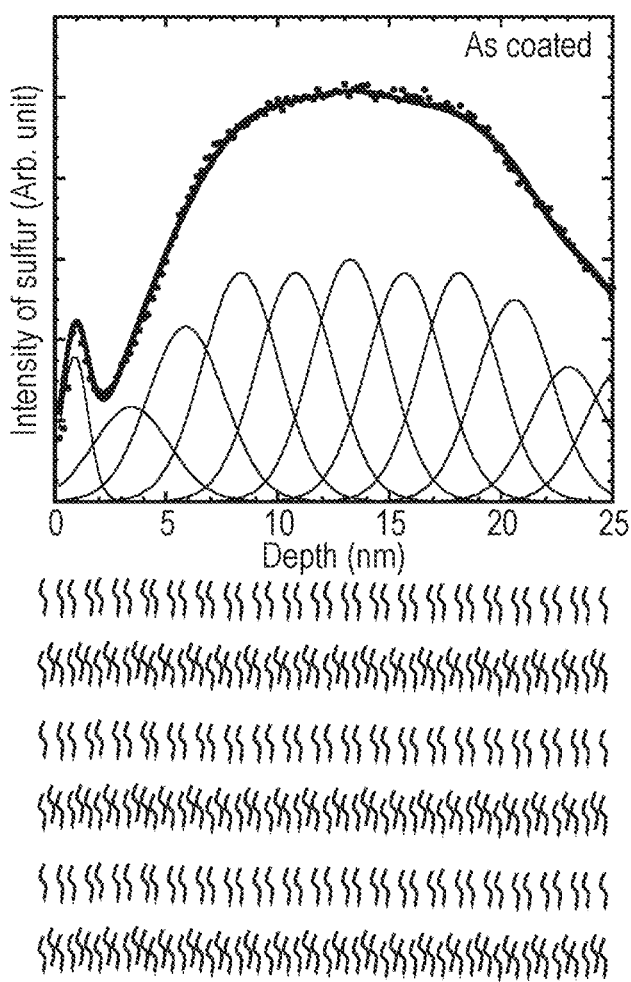
FIG. 7 is a graph used to determine positions of sulfur atoms after coating (without performing post-treatment).
Figure 8:
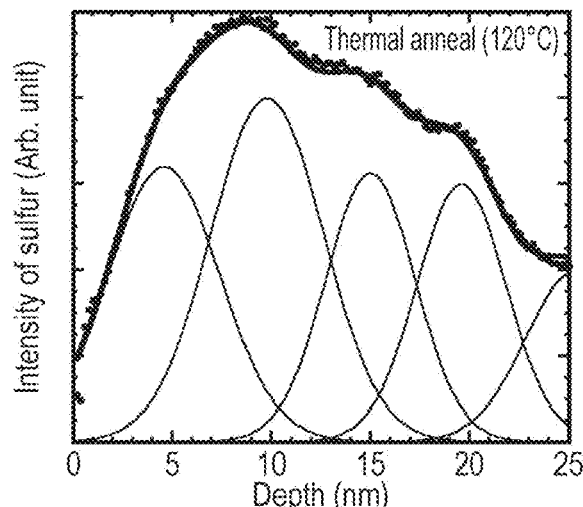
FIG. 8 is a graph used to determine positions of sulfur atoms after thermal anneal.
Figure 8:
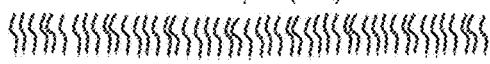
Figure 8:
Figure 8:
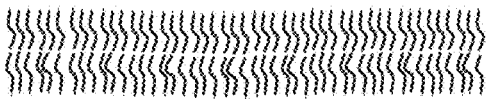
Figure 8:
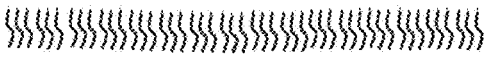

In the as-coated film having a monolayer structure, the depth profile of sulfur atoms present only in the core portions by TOF-SIMS did not indicate the distribution (FIG. 7, sulfur atoms were present every about 2.5 nm, which corresponds to the length of a molecule). In contrast, in the thin film that had been subjected to the thermal anneal at 120° C. for 5 minutes, peaks were observed every about 5 nm, which corresponds to the length of two molecules, in the distribution profile of the sulfur atoms (FIG. 8). The results demonstrated that the thin film had the bilayer structure.

Taken together with these results, it is presumed that although the as-coated polycrystalline thin film has a monolayer structure, the structure is changed by the thermal anneal at 120° C. to the bilayer structure in which the core portions face each other, like the single crystal obtained by recrystallization from the solution.

Figure 9:
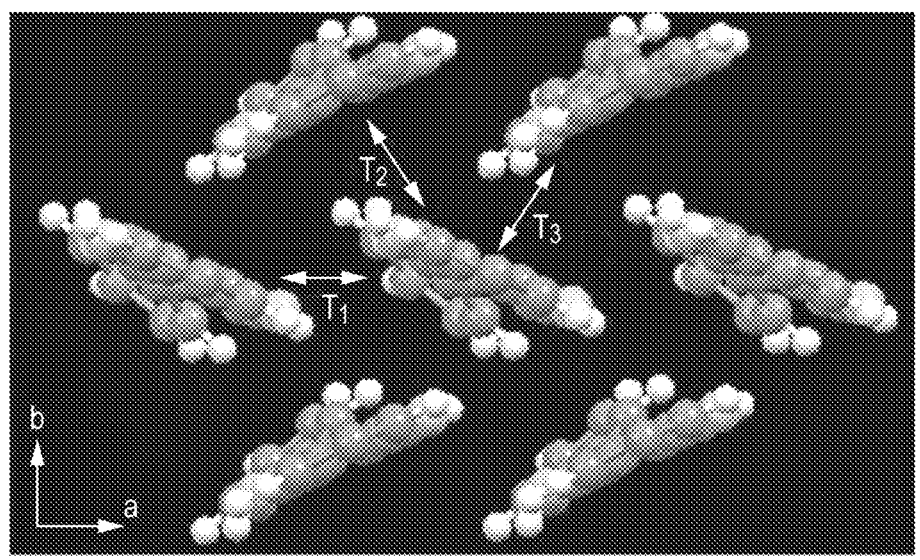
FIG. 9 illustrates single-crystal compound 24.
Figure 10:
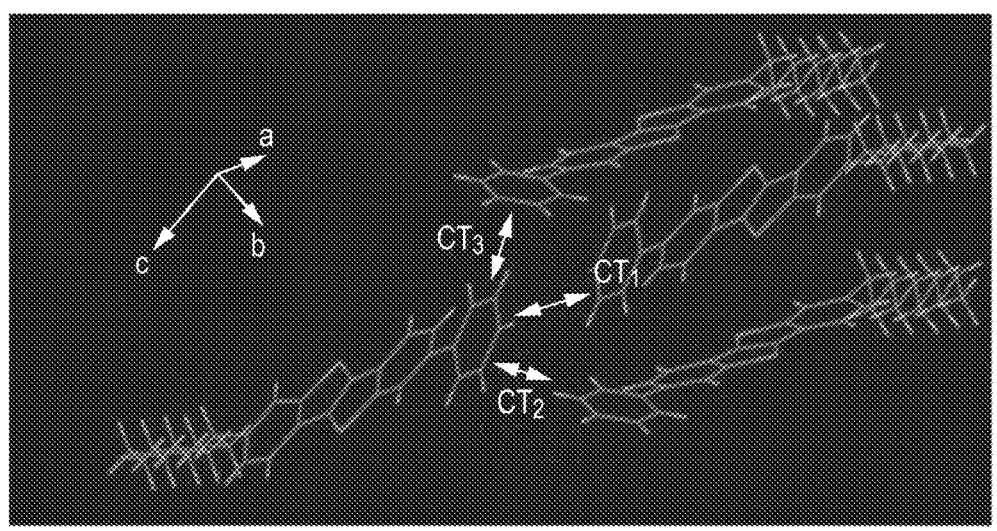
FIG. 10 illustrates single-crystal compound 24.

The calculation of the transfer integral on the basis of the molecular configuration determined by the single-crystal structure analysis indicated that T1, T2, and T3 in the layer were 55, 17, and 43 meV, respectively, (FIG. 9) and that a significant value of about 8 meV was obtained between the layers in which the core portions faced each other (FIG. 10).

INDUSTRIAL APPLICABILITY

In the organic thin film according to the present invention, the organic thin film resulting from the specific liquid crystal substance and having the bilayer structure, the r-conjugated aromatic system extends continuously. Thus, the organic thin film should have high mobility and can be used as a high-quality, uniform organic semiconductor thin film with fewer defects.

Specifically, the organic thin film can be used for optical sensors, organic EL devices, organic transistors, organic solar cells, organic memory devices, and so forth.

The invention claimed is:

1. An organic thin film comprising: a compound, which is a liquid crystal compound, containing a charge transporting molecular unit A having a structure of an aromatic fused ring system represented by the general formula (1) and a side chain, wherein the film has a bilayer structure formed of the liquid crystal compound, indicating a bimolecular layer-like structure, in which two charge transporting molecular units A face each other to form a pair, thereby forming a paired layer such that peaks corresponding to a length of two molecules forming the paired layer are observed in X-ray structure analysis,

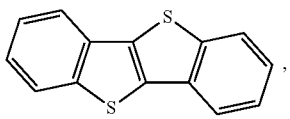, (1)

wherein the side chain is an optionally substituted alkyl group having 2 to 20 carbon atoms, an optionally substituted alkenyl group having 2 to 20 carbon atoms, an alkyloxy group having 2 to 20 carbon atoms, an alkylthio group having 2 to 20 carbon atoms, or a group represented by the general formula (2):

$(CH_2)_n-X-(CH_2)_m-CH_3$ (2)

wherein X represents S, O, or NH, m represents an integer of 0 to 17, and n represents an integer of 2 or more,
wherein the compound further contains a cyclic structure unit C linked to the charge transporting molecular unit,
wherein the compound exhibits a liquid crystal phase selected from the group consisting of SmB, SmBcrystal, SmI, SmF, SmG, SmE, SmJ, SmK, and SmH, and
wherein the number (NC) of number of rings in the cyclic structure unit C and the number (NA) of fused rings in the charge transporting molecular unit A satisfy the relationship: NA≥NC.

2. The organic thin film according to claim 1, wherein the cyclic structure unit C is a unsubstituted aromatic hydrocarbon group, an aromatic hydrocarbon group substituted with a halogen or a lower alkyl group having 1 to 4 carbon atoms, an unsubstituted heteroaromatic group, a heteroaromatic group substituted with a halogen or a lower alkyl group having 1 to 4 carbon atoms, or represented by (3) or (4):

 (3)

 (4)

(wherein $Ar_1$ represents an unsubstituted aromatic hydrocarbon group, an aromatic hydrocarbon group substituted with a halogen or a lower alkyl group having 1 to 4 carbon atoms, an unsubstituted heteroaromatic group, or a heteroaromatic group substituted with a halogen or a lower alkyl group having 1 to 4 carbon atoms, $Ar_2$ represents an optionally substituted aromatic hydrocarbon group, R' represents an unsubstituted aromatic hydrocarbon group, an aromatic hydrocarbon group substituted with a halogen or a lower alkyl group having 1 to 4 carbon atoms, an unsubstituted heteroaromatic group, or a heteroaromatic group substituted with a halogen or a lower alkyl group having 1 to 4 carbon atoms).

3. A method for producing an organic thin film according to claim 1, the method comprising a step of subjecting the organic thin film to annealing.

4. An organic semiconductor device comprising the organic thin film according to claim 1.

5. An organic transistor comprising the organic thin film according to claim 1, the organic thin film being used as an organic semiconductor layer.

6. An organic semiconductor device comprising an organic thin film produced by the method for producing an organic thin film according to claim 3.

7. An organic transistor comprising an organic thin film produced by the method for producing an organic thin film according to claim 3, the organic thin film being used as an organic semiconductor layer.

* * * * *